United States Patent [19]
Noll et al.

[11] Patent Number: 6,058,252
[45] Date of Patent: May 2, 2000

[54] SYSTEM AND METHOD FOR GENERATING EFFECTIVE LAYOUT CONSTRAINTS FOR A CIRCUIT DESIGN OR THE LIKE

[75] Inventors: Mark D. Noll, Santa Clara, Calif.; Kenneth E. Scott, Sherwood, Oreg.; Robert L. Walker, Boulder, Colo.

[73] Assignee: Synopsys, Inc., Mountain View, Calif.

[21] Appl. No.: 08/910,803

[22] Filed: Aug. 13, 1997

Related U.S. Application Data

[63] Continuation of application No. 08/375,455, Jan. 19, 1995, abandoned.

[51] Int. Cl.$^7$ .............................. G06F 9/455; H01L 21/70
[52] U.S. Cl. ........................... 395/500; 364/490; 364/491
[58] Field of Search ................................... 364/488, 489, 364/490, 491, 578; 395/500

[56] References Cited

U.S. PATENT DOCUMENTS

| | | |
|---|---|---|
| 3,629,843 | 12/1971 | Scheinman . |
| 4,593,363 | 6/1986 | Burstein et al. . |
| 4,615,011 | 9/1986 | Linsker . |
| 4,630,219 | 12/1986 | DiGiacomo et al. . |
| 4,656,580 | 4/1987 | Hitchcock, Sr. . |
| 4,763,288 | 8/1988 | Deering et al. . |
| 4,901,260 | 2/1990 | Lubachevsky . |
| 4,937,827 | 6/1990 | Beck et al. . |
| 4,970,180 | 11/1990 | Sugino et al. . |
| 5,003,487 | 3/1991 | Drumm et al. . |
| 5,046,017 | 9/1991 | Yuyama et al. . |
| 5,095,454 | 3/1992 | Huang . |
| 5,126,966 | 6/1992 | Hafeman et al. . |
| 5,168,455 | 12/1992 | Hooper . |
| 5,191,541 | 3/1993 | Landman et al. . |
| 5,210,700 | 5/1993 | Landman et al. . |
| 5,218,551 | 6/1993 | Agrawal et al. . |
| 5,253,363 | 10/1993 | Hyman . |
| 5,396,435 | 3/1995 | Ginetti ..................................... 364/489 |
| 5,402,357 | 3/1995 | Schaefer et al. ......................... 364/490 |
| 5,426,591 | 6/1995 | Ginetti et al. ........................... 364/489 |
| 5,452,239 | 9/1995 | Dai et al. ................................. 364/578 |
| 5,461,576 | 10/1995 | Tsay et al. ............................... 364/490 |
| 5,654,898 | 8/1997 | Roetcisoender et al. ............... 364/490 |
| 5,666,290 | 9/1997 | Li et al. .................................. 364/491 |

OTHER PUBLICATIONS

The Olumpus Synthesis System, Giovanni De Micheli et al., IEEE, Oct., 1990.

*Primary Examiner*—Kevin J. Teska
*Assistant Examiner*—Dan Fiul
*Attorney, Agent, or Firm*—Kolisch, Hartwell, Dickinson, McCormack & Heuser

[57] ABSTRACT

A computer system and computer implemented method for deriving constraints with which to direct automatic integrated circuit layout is disclosed. The present invention is particularly adapted for use in the design of large integrated circuits with complex synchronous timing behavior. Preferably, the invented computer system includes means for storing a netlist data structure within a storage means is provided, the netlist data structure representing a circuit configuration having a plurality of circuit elements and representing static timing information for the circuit configuration; means for selecting specified circuit elements to be used for generating the layout constraints, whereby the specified circuit elements that are selected are fewer than, i.e. represent a proper subset of, the plurality of circuit elements of the circuit configuration; means for identifying a most critical path through each of the specified circuit elements based upon the static timing information, whereby preferably the most critical path is that path having the least slack defined as the difference between a required time at which a signal should reach the specified circuit element and an arrival time at which the signal is expected to reach the specified circuit element; and means for generating layout constraints from the most critical path through each of the specified circuit elements, whereby at least one constraint is generated covering each of the specified circuit elements. Also disclosed is a feature whereby any paths that do no meet specified filter criteria, and paths that are duplicates of others, are discarded, thereby retaining only irredudant critical paths on which to base layout constraints.

16 Claims, 17 Drawing Sheets

SYSTEM AND METHOD FOR GENERATING EFFECTIVE LAYOUT CONSTRAINTS FOR A CIRCUIT DESIGN OR THE LIKE

This is a file wrapper continuation of application Ser. No. 08/375,455 filed Jan. 19, 1995 now abandoned.

BACKGROUND OF THE INVENTION

1. Field of the Invention

The field of the present invention relates in general to automated design techniques for electronic circuits. More particularly, the field of the invention relates to a system and method for directing automatic integrated circuit (IC) layout tools to produce implementations which meet the timing requirements of complex digital systems.

2. Background

The implementation chosen by an automatic IC layout tool for an electronic circuit has an impact on that circuit's timing behavior. IC layout tools determine the physical placement of cells in a circuit and the routing of wires which connect those cells together. The length of the wires impacts both the speed with which electrical signals may propagate through the cells as well as the speed with which signals may propagate from one cell to the next. As IC process technology has advanced, the inherent delay through cells has decreased, while the influence of wire length on final circuit speed has increased.

Because of the increased importance of wire length on circuit speed, mechanisms have been developed for controlling the layout process based on the circuit's desired timing objectives. For instance, some conventional layout tools allow a priority to be associated with wires that are deemed critical to the final circuit performance—cells are then placed and wires are then routed such that the lengths of the high priority wires are made as short as possible. A refinement of this method involves specifying a desired wire length (or wire capacitance) objective for critical wires—wires with shorter length (or lower capacitance) objectives are given a higher priority during layout.

Wire-based constraint methods can be overly restrictive, given that the desired objective in synchronous circuits is to propagate a signal from one storage element through a sequence of cells and wires to another storage element in a fixed window of time. An alternative is to specify path-based constraints. Path-based timing-driven layout methods evolved out of the desire to give layout tools more flexibility in meeting a circuit's timing objectives by considering all the wires along a path at once, rather than restricting the wires individually. Therefore, path-based constraints are generally preferred over wire-based constraints for layout tools.

A disadvantage to path-based methods, however, is that there are often too many paths through a circuit for a layout tool to consider them all. In fact, the input file containing the path constraints can readily exceed the storage capacity of a typical computer system if all paths are included. Therefore, the number of paths that are considered by, and provided to, a layout tool should be limited by some practical constraint. Some conventional path-based constraint methods limit the number of paths that can be considered to some small number (10–100) based on the layout tool's need to incrementally update the timing of all paths after each placement or routing decision.

For simple circuits, the designer may manually choose which paths should be provided to the layout tool. Some automated tools also limit the number of paths by providing only a specified number of paths that exceed their timing constraints by the greatest margin or that come closest to exceeding their timing constraints (the "N worst paths" approach).

Automated methods and systems for providing constraints to layout tools are typically based on static timing analysis. Static timing analysis tools are used to analyze circuit implementations to see if they can perform correctly based on their timing constraints. Static timing analysis tools can efficiently analyze the paths in a circuit to ensure that their delay is less than what is required to allow the chip to operate at the desired speed. To effectively constrain a layout tool requires a translation from the higher level constraints understood by static timing analysis tools to the constraint mechanism provided by the targeted layout tool. This translation is best accomplished by a tool which can consider all constraints and choose those most appropriate to be passed to the targeted layout system.

Several systems have been developed to generate layout constraints based on the higher level constraints of static timing analysis tools. One conventional method translates a design's static timing constraints into maximum wire capacitance limits, such that if the targeted layout is able to meet all of the constraints the circuit will operate at the desired clocking frequencies. This method suffers from the drawbacks inherent with conventional wire-based constraint methods. Static timing analysis tools have also been developed which use a design's static timing constraints to determine the N worst paths through the circuit (that is, the N paths exceeding their timing constraints by the greatest margin or coming closest to exceeding their timing constraints if less than N paths exceed their timing constraints), where N is a number specified by the designer. Although this method offers the target layout tool more flexibility in developing the circuit implementation, it suffers from three serious limitations:

1) The total number of paths in a circuit may overwhelm the target layout tool or require so much storage space as to overwhelm the computer system on which they were generated.

2) If the total number of paths in a circuit is very large, limiting the number of path constraints generated to N may generate redundant (and therefore useless) constraints for some parts of the circuit, while other parts of the circuit remain unconstrained.

3) Finally, even if the circuit does not contain many redundant paths, it is unclear as to how a designer can select N such that the circuit's timing objectives are neither under specified nor over specified, other than by trial and error. If N is set too low, the design may not meet its constraints after layout; if N is set too high, then the layout tool may take an unacceptably long time to create the layout.

FIG. 1 is a simplified block diagram illustrating a conventional system, generally indicated at 100, in which a static timing analysis tool uses a circuit design's static timing constraints to determine the N worst paths through the circuit, and uses these N worst paths to generate the layout constraints. An example of such a system is the Synopsys Design Compiler Version 3.0 developed by Synopsys, Inc., assignee of record of the present invention.

The conventional system of FIG. 1 receives a circuit design netlist 102 and design timing constraints 104 and generates formatted layout constraints 106 for a circuit layout tool (not shown). In addition, the system receives an integer input N representing the number of worst paths to be generated and considered in determining the layout constraints. The system 100 may also reference a technology library 108 which contains timing information for the basic circuit blocks, called leaf cells, which are used to make up the circuit design netlist.

The system 100 includes several software modules and data structures, including: a netlist data structure 112 for storing information about a circuit design; netlist access routines 114 which allow other modules in the system to access the netlist data structure 112; a static timing analysis module 116 for performing static timing analysis on the netlist stored in the netlist data structure 112; an N worst paths generation module 118 which uses the netlist and static timing analysis data to generate the N paths through the circuit with the most critical constraints; and an output formatting module 120 which accepts the N worst paths from the N worst paths generation module 118 and extracts and formats layout constraints from the worst paths so that they may be used by a circuit layout tool.

In operation, information from the design netlist 102 is first loaded into the netlist data structure 112, which is a conventional data structure for storing netlist information. The static timing analysis module then uses design timing constraints 104 and information from the technology library 108, in conjunction with the netlist information from the netlist data structure 112 (accessed using the netlist access routines 114), to perform static timing analysis on the circuit design. The results of the static timing analysis are then stored in the netlist data structure using the appropriate netlist access routines 114.

Next, the N worst paths generation module 118 analyzes the results of the static timing analysis to rank the paths through the circuit design with respect to their estimated delay relative to their timing constraints. For a given path through the circuit, an arrival time may be calculated estimating the time it will take a signal to propagate through the path in the circuit, and a required time may be determined from design timing constraints 104 at which time the signal must propagate through the path in order to meet the timing constraints. The path may be ranked by calculating "slack" for the path, which is the required time minus the arrival time. Slack may be negative if a timing constraint is violated. The N paths with the least slack are selected as the N worst paths through the circuit. These are the paths that exceed their timing constraints by the greatest margin or that come closest to exceeding their timing constraints. These N worst paths are provided to the output formatting module 120.

The output formatting module 120 accepts the N worst paths from the N worst paths generation module 118 and extracts and formats layout constraints from the worst paths, and delivers the formatted layout constraints 106 for use by a circuit layout tool (not shown). A variety of known formats for the layout constraints, such as Standard Delay Format (SDF), may be used.

What is needed is an improved system and method for generating constraints for layout tools. Preferably, such a system and method would efficiently convey enough information to ensure that timing constraints will be met after layout without generating constraints for all paths through a circuit, would be easily understood and used by designers, and would support a wide variety of target layout systems.

SUMMARY OF THE INVENTION

Aspects of the present invention provide a computer system and computer-implemented method for deriving an effective set of layout constraints with which to direct automated IC layout tools. Embodiments of the present invention are particularly well suited for use on large electronic circuit designs with complex synchronous timing relationships.

One aspect of the present invention allows the most important paths in the circuit to be enumerated. This aspect of the present invention allows the path having the most critical timing constraint for a given circuit element to be generated, preferably without examining all paths through the circuit element. It is an advantage of this and other aspects of the present invention that layout constraints may be generated from the most critical paths through selected circuit elements rather than from the overall N worst paths through the circuit. It is a further advantage of these and other aspects of the present invention that path-based constraints may be generated that cover each of the desired circuit elements without generating constraints for additional paths through the circuit.

More particularly, in an embodiment of the present invention, static timing analysis may be used to generate the most critical path for each wire (referred to as a net) in the circuit. Alternatively, in the case where the targeted layout tool understands how to prioritize amongst the different driver/load pairs on an individual net, static timing analysis may be used to generate the most critical path going through each driver/load pin pair on each net in the circuit. This set of paths represents the most important constraints which must be applied to every net (or driver/load pin pair) in the circuit, and conveys this information with less redundancy than conventional systems. It is an advantage of these and other aspects of the present invention that the paths considered for generating layout constraints may be matched to the capabilities of the targeted layout tool.

Another aspect of the present invention allows a set of paths to be filtered to accommodate the capacity limitations of the targeted layout tool. In particular, the designer may specify that only paths which are within a certain number of nanoseconds of violating their timing constraints should be listed—in this case all less critical paths would be filtered from the list. The designer may also elect to only allow the N most critical of these paths to remain in the set—this is different from the prior methods in that N paths are selected from a subset of less redundant paths, ideally resulting in the most relevant constraints that may be specified using only N paths.

Yet another aspect of the present invention uses the subset of paths described above to generate constraints in the format most appropriate for the targeted layout tool. Wire priority constraints may be generated by associating higher priorities with those wires on paths which are close to violating their constraints, decreasing the priority as more slack is available on the path. Wire capacitance constraints may be generated for all wires covered by the path set. The number of wires on which priority or capacitance constraints will be set may be limited by the designer. Path delay constraints may be generated simply by enumerating each path in order of increasing slack for the path. It is an advantage of this aspect of the present invention that appropriate layout constraints can be generated efficiently for different target classes of layout tools.

BRIEF DESCRIPTION OF THE DRAWINGS

These and other features and advantages of the present invention will become more apparent to those skilled in the art from the following detailed description in conjunction with the appended drawings in which.

DESCRIPTION

One aspect of the present invention provides a system and method for enhancing the automated design of electronic circuits. The following description is presented to enable any person skilled in the art to make and use the invention. Descriptions of specific applications are provided only as examples. Various modifications to the embodiments described will be readily apparent to those skilled in the art, and the generic principles defined herein may be applied to other embodiments and applications without departing from the spirit and scope of the invention. Thus, the present invention is not intended to be limited to the embodiment described, but is to be accorded the widest scope consistent with the principles and features disclosed herein.

Figure 1:
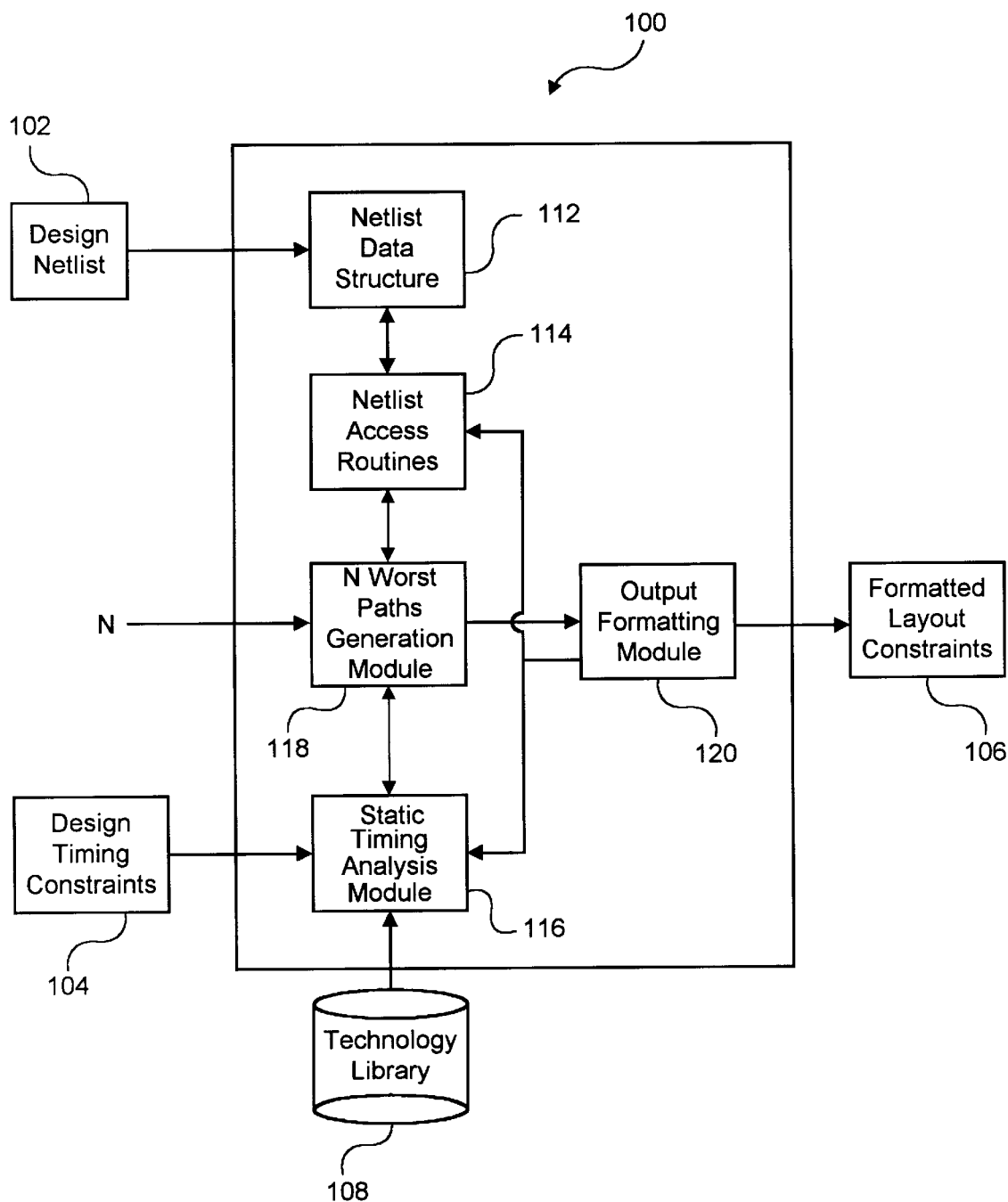
FIG. 1 is a simplified block diagram illustrating a conventional system for processing a netlist to generate layout constraints.
Figure 2:
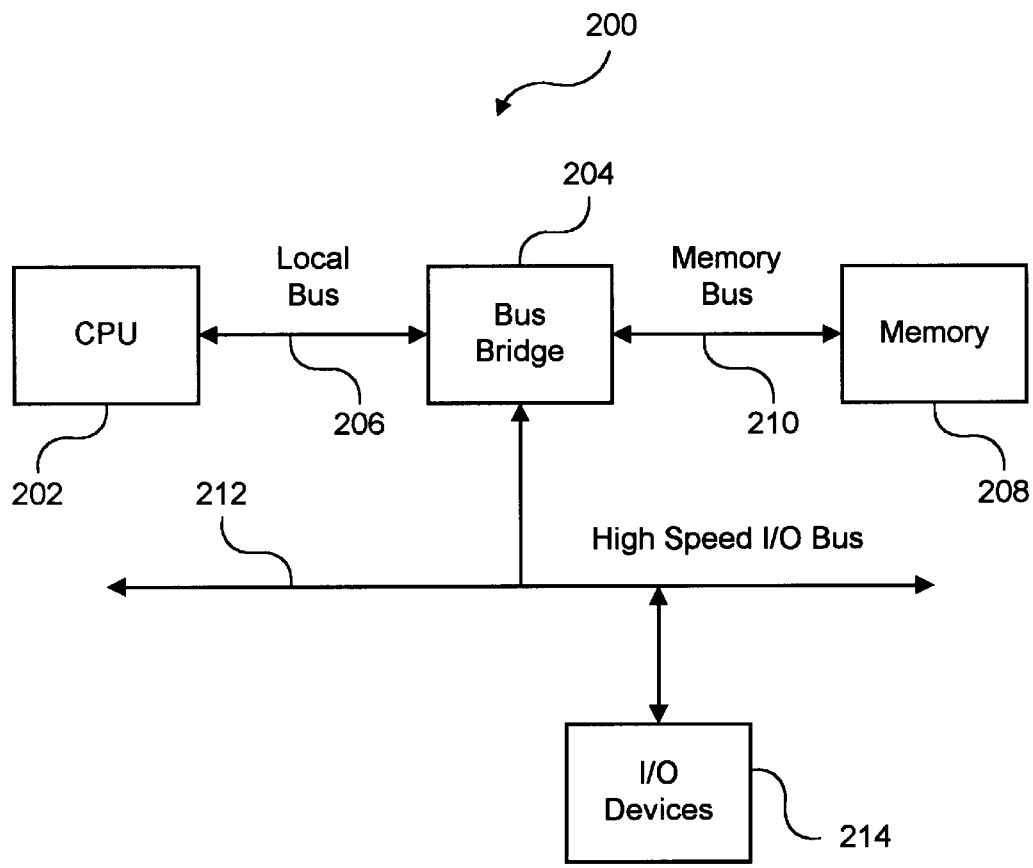
FIG. 2 is a simplified block diagram illustrating a computer system which may be used in conjunction with a first embodiment of the present invention.

FIG. 2 is a simplified block diagram illustrating a general purpose programmable computer system, generally indicated at 200, which may be used in conjunction with a first embodiment of the present invention. In the presently preferred embodiment, a Sun Microsystems SPARC Workstation is used. Of course, a wide variety of computer systems may be used, including without limitation, workstations running the UNIX system, IBM compatible personal computer systems running the DOS operating system, and the Apple Macintosh computer system running the Apple System 7 operating system. FIG. 2 shows one of several common architectures for such a system. Referring to FIG. 2, such computer systems may include a central processing unit (CPU) 202 for executing instructions and performing calculations, a bus bridge 204 coupled to the CPU 202 by a local bus 206, a memory 208 for storing data and instructions coupled to the bus bridge 204 by memory bus 210, a high speed input/output (I/O) bus 212 coupled to the bus bridge 204, and I/O devices 214 coupled to the high speed I/O bus 212. As is known in the art, the various buses provide for communication among system components. The I/O devices 214 preferably include a manually operated keyboard and a mouse or other selecting device for input, a CRT or other computer display monitor for output, and a disk drive or other storage device for non-volatile storage of data and program instructions. The operating system typically controls the above-identified components and provides a user interface. The user interface is preferably a graphical user interface which includes windows and menus that may be controlled by the keyboard or selecting device. Of course, as will be readily apparent to one of ordinary skill in the art, other computer systems and architectures are readily adapted for use with embodiments of the present invention.

Overview

Figure 3:
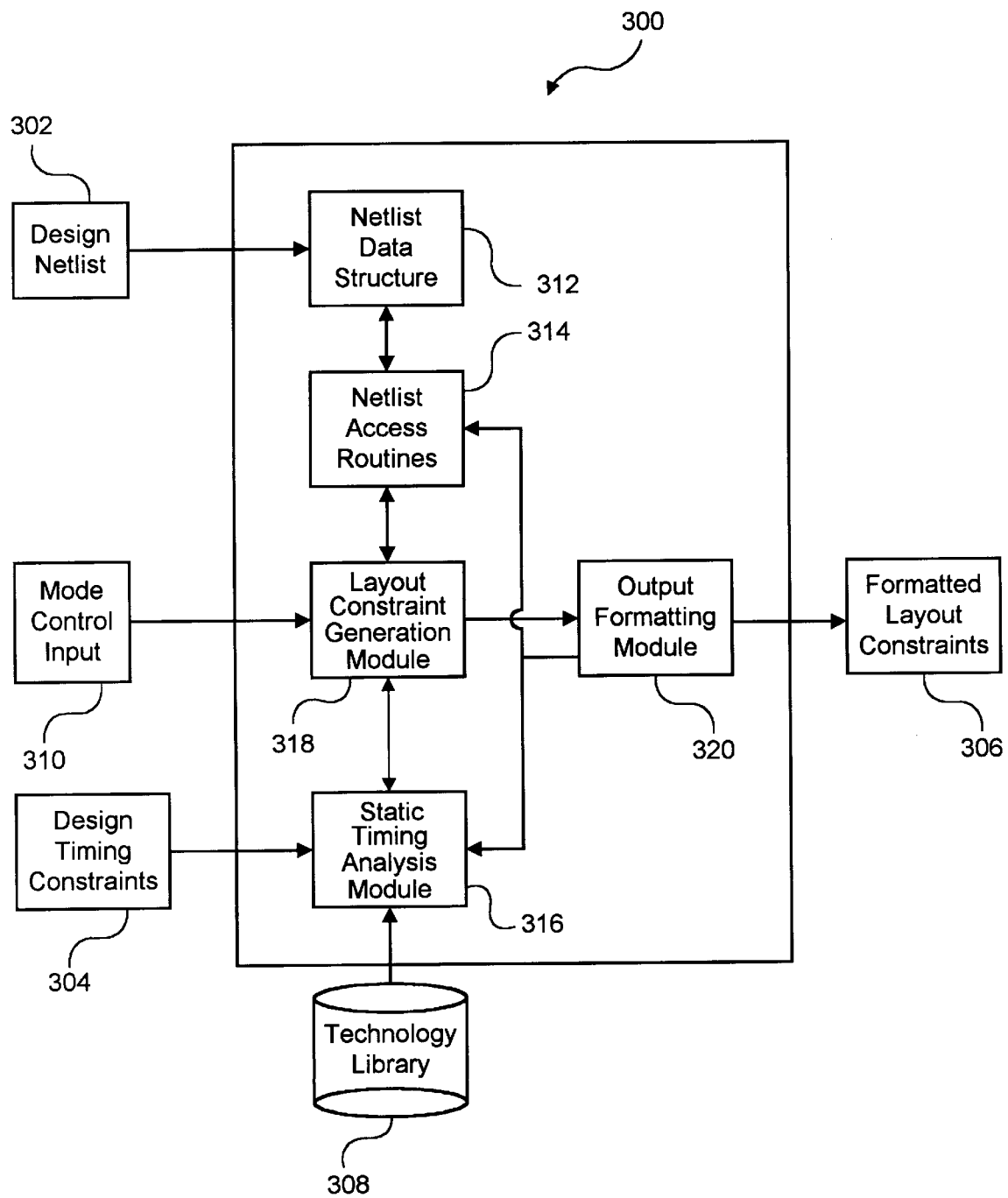
FIG. 3 is a simplified block diagram of a system for processing a circuit design netlist according to a first embodiment of the present invention.

FIG. 3 is a simplified block diagram of a system, generally indicated at 300, for processing a circuit design netlist according to a first embodiment of the present invention. In the first embodiment, the system comprises software instructions in memory 208 which are executed by CPU 202. Data inputs and outputs for the system 300 may be retrieved from or stored to memory 208 or I/O devices 214, such as a disk drive. It will be readily understood by those of ordinary skill in the art that while software instructions and data may reside in memory or on a disk, they will be provided to CPU 202 for processing. Caching, paging and other memory management techniques may also alter the location of the software instructions and data without interfering with the operation of the system according to the first embodiment.

The system of the first embodiment receives a circuit design netlist 302, and design timing constraints 304 and generates formatted layout constraints 306 for a circuit layout tool (not shown). The system 300 may also reference a technology library 308 for timing information for the basic circuit blocks, called leaf cells, which are used to make up the circuit design netlist. In addition, mode control input 310 may be provided to the system 300 to indicate the type of processing that is desired as well as the formats for inputs and outputs.

Circuit design netlists 302 typically reflect the design of a circuit by reciting the connections among basic circuit blocks. The circuit blocks are referred to as cell instances and reference leaf cells in the technology library containing timing information for that type of cell. For instance, a circuit design represented in a netlist may have multiple NAND gates. Each NAND gate would be represented as a cell instance in the netlist. While there may be multiple NAND gate cell instances in the circuit design netlist, they may all reference a single NAND gate leaf cell in technology library 308 which contains timing and other information common to all NAND gates. The cell instances in a netlist are connected by nets which represent wire or other conductive interconnect between cell instances in the circuit. Cell instances are connected to nets by pins which may place a signal on a net (a driver pin), or receive a signal from the net (a load pin). The portion of a net connecting a specific driver pin to a specific load pin is referred to as a net segment. A net having multiple pins will have multiple net segments. Other circuit elements, such as input and output ports, may also be represented in a netlist as will be discussed further below.

Importantly, for most circuit design netlists 302, the system 300 will generate formatted layout constraints 306 based upon only a subset of all the possible signal paths through the circuit. Further, the paths included in the subset of paths are preferably selected based upon the likelihood that they will provide unique information that may be used by a layout tool and are preferably prioritized based upon the respective delay relative to the timing constraint on the path. This may be accomplished by analyzing selected circuit elements in the netlist and by including only the worst path through each circuit element. In the first embodiment the worst path is the path having the least slack, where slack for the path is the required time within which a signal must propagate through the path to meet timing constraints minus the arrival time at which a signal is estimated to propagate through the path. This is the path that exceeds its timing constraints by the greatest margin (or comes closest to exceeding its timing constraints if none of the paths exceed their timing constraints). Additional or alternative criteria may also be used to route paths, such as the strength of driver pins along the path, or the relative ability to substitute faster circuit elements along the path (which may reflect the ability to decrease delay without changing layout and may cause the layout of paths without this flexibility to be ranked as more critical).

In this way, the layout tool may be provided with at least one constraint for each of the selected circuit elements in the netlist. In particular, in a first mode of operation, the system of the first embodiment considers the worst path through each driver to load pin pair on a net for each net in the netlist. This assures that each net segment is constrained. In a second mode of operation, the system of the first embodiment only considers the worst path through each driver pin in the netlist.

This approach provides an important advantage over conventional systems that select a subset of paths based upon an overall ranking of the delay relative to the constraints on the paths (the N worst paths method). Often such conventional systems will select many paths that pass through a single critical cell in order to generate layout constraints. However, this conventional approach is likely to include many paths through critical cells that are redundant and provide no additional useful information to the layout tool. Therefore, paths through critical cells may be over represented when the N worst paths method is used, while paths through other cells may not be used to generate layout constraints even though they would provide useful information to the layout tool. In fact, some cell instances or cell instance pins may not have any associated layout constraint if an N worst paths approach is used. The system 300 according to the first embodiment, however, may be used to ensure that the most critical path for each pin or net segment is considered when generating layout constraints. It should be noted that the system of the first embodiment provides a method for selecting and generating the worst path through a selected pin or net segment without having to generate and compare all of the paths through the pin or net segment (which may consume a prohibitive amount of memory and bandwidth).

The system 300 preferably comprises several software modules and data structures, including: a netlist data structure 312 for storing information about a circuit design; netlist access routines 314 which allow other modules in the system to access the netlist data structure 312; a static timing analysis module 316 for performing static timing analysis on the netlist stored in the netlist data structure 312; a layout constraint generation module 318 which uses the netlist and static timing analysis data to generate a subset of paths for specified pins or net segments (as defined by driver to load pin pairs on a net) in the netlist from which layout constraints may be generated; and an output formatting module 320 which accepts the subset of paths from the layout constraint generation module 318 and extracts and formats layout constraints from that subset of paths so that they may be used by a circuit layout tool. It is an advantage of the architecture of the system of the first embodiment that a conventional netlist data structure, netlist access routines, static timing analysis module, and output formatting module may be used with only minor modifications.

Figure 4:
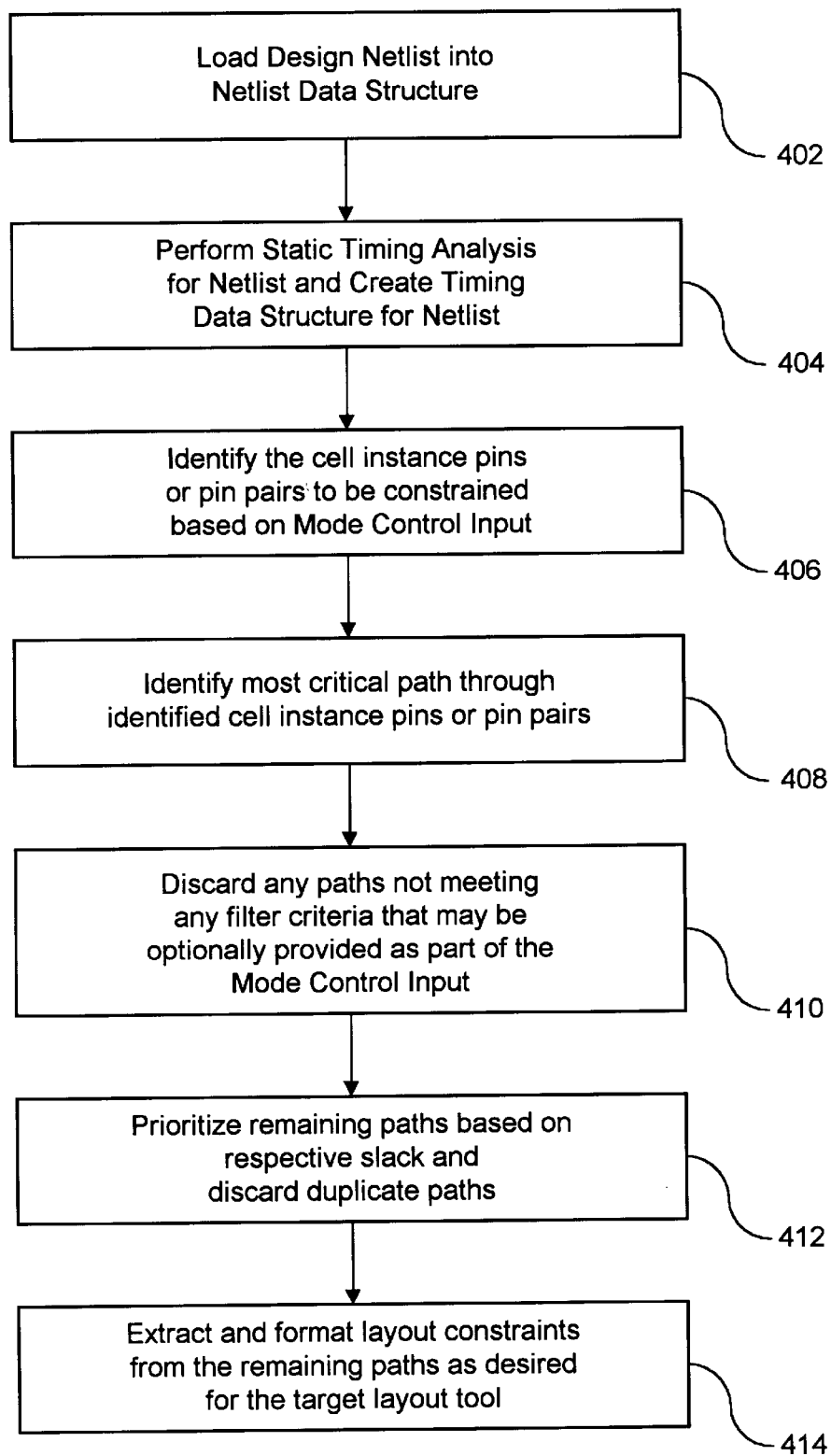
FIG. 4 is a flow chart of the overall method of processing a netlist according to a first embodiment of the present invention.

FIG. 4 is a flow chart of the overall method of processing a netlist according to a first embodiment of the present invention. First, at step 402, information from a design netlist 302 is loaded into a netlist data structure which stores and organizes the information in memory. For instance, a file containing a design netlist 302 in a standard Electronic Design Interchange Format (EDIF) may be parsed and the information may be loaded into corresponding fields of the netlist data structure 312 in memory 208. If the system 300 is used in conjunction with another automated design tool, such as a circuit synthesis tool, which has already constructed a netlist data structure 312, the netlist data structure 312 may be provided to the system 300 directly by passing a pointer to the netlist data structure rather than parsing and loading information from a file. It should be understood that the netlist data structure 312 in the first embodiment may be a conventional data structure for storing netlist information. What is desired for the first embodiment is a data structure that is capable of storing the netlist information that is used by the static timing analysis module 316 and layout constraints generation module 318, and that associates the information in a structure in memory that allows efficient processing by those modules. In the first embodiment, accesses to the netlist data structure 312 are controlled by netlist access routines 314 which may provide procedures for querying the netlist data structure for information, allocating and deallocating memory for fields in the netlist data structure, modifying the data in the fields of the netlist data structure, and adding new data to fields of the netlist data structure. Of course, it will be readily apparent to those of ordinary skill in the art that the netlist data structure 312 could be accessed directly without the use of centralized access routines.

Referring to FIG. 4, at step 404, the system 300 then performs static timing analysis for the netlist and creates timing data structures containing timing information about the circuit design represented in the netlist. The timing data structures may be linked to the netlist data structure 312, so that timing information may be retrieved while traversing the netlist data structure. A wide variety of methods are known for performing static timing analysis and a large variety of conventional static timing analysis methods and data structures may be used in conjunction with aspects of the present invention. What is desired for the first embodiment, however, are a static timing analysis method and data structure that allow the worst path through a given pin or net segment to be determined efficiently (where the worst path is defined in the first embodiment as being the path having the least slack). While the particular static timing analysis algorithm used will alter the timing values that are generated, it is the structure and accessibility of the resulting information that is important for the first embodiment of the present invention. The first embodiment will simply identify the worst path through a selected pin or net segment based upon whatever static timing analysis method is used.

In the first embodiment, the static timing analysis module 316 uses design timing constraints 304 and information from a technology library 308 to perform static timing analysis. A variety of formats are known for providing design timing constraints to a static timing analyzer. In the first embodiment, the design timing constraints may include, without limitation, an indication of when signals arrive at input ports, the strength of the signals at the input ports, when signals are required at output ports, and the capacitive loads on the output ports. Clock cycles for various circuit components may also be provided to the static timing analysis module 316. The static timing analysis module 316 may generate additional constraints based upon the clock cycles. For instance, the static timing analysis module 316 may determine that a signal must propagate from one flip-flop to another flip-flop sharing the same clock within the cycle time of that common clock. The static timing analysis module 316 is also provided with timing information regarding propagation delay through a cell (or set-up times for a flip-flop) by a technology library 308 which is typically provided by the designer of the cell. The format of technology libraries may vary by designer or vendor and timing information may need to be parsed into an internal technology library data structure for use by the static timing analysis module 316. Using the above information, the static timing analysis module 316 may then store the results of the static timing analysis in association with cell instances, pins, and nets in the netlist data structure 312 by using appropriate netlist access routines 314. In the first embodiment, this allows timing information for different parts of the circuit design to be accessed by traversing through the netlist data structure 312.

Referring to FIG. 4, at step 406, the layout constraints generation module 318 then identifies the cell instance pins or pin pairs (which define net segments) to be constrained based upon the mode control input 310. Two basic modes of operation may be selected by the mode control input 310— cover_design and cover_nets (other options and refinements will be discussed below). If the mode control input 310 selects the cover_design option, the layout constraint generation module 318 considers the most critical path through each driver to load pin pair defining a net segment in the netlist. This means that for each driver pin to load pin path segment on a net, the layout constraint generation module 318 will consider the most critical path (that is the path with the least slack) that includes that net segment. This aspect of the first embodiment ensures that each net segment in the circuit will have its most critical timing constraint considered when layout constraints are generated. Thus, if the cover_design option is selected, at step 406, the layout constraint generation module 318 will generate a set of all driver to load pin pairs in the netlist for further processing. For nets having only one driver pin, this is the same as generating a set of all load pins in the netlist. Thus, if only single driver nets will be used (or if the extra constraints for multidriver nets are ignored), processing may be simplified by only using load pins. The set of pin pairs or pins is extracted from the netlist data structure 312 using netlist access routines 314.

If the mode control input 310 selects the cover_nets option, the layout constraint generation module 318 considers the most critical path through each driver pin in the netlist. This is equivalent to considering the most critical path through each net except in cases where there are multiple driver pins on a single net (as may be the case with a tri-state bus or network). The cover_nets option will generally consider fewer paths than the cover_design option and may leave some path segments unconstrained or under constrained for layout tools that are capable of using pin-to-pin based layout constraints. However, some layout tools are not capable of considering path-based constraints and rather seek to minimize the capacitance of critical nets. These layout tools only need, and can only use, information regarding the most critical constraint for each net. The cover_nets option in the system of the first embodiment provides just the information that such net capacitance layout tools are capable of using. By matching the paths that are considered to the capability of the target layout tool, the layout constraint generation module 318 is able to reduce the number of paths that must be considered. The cover_nets option of the first embodiment does, however, ensure that each net in the circuit will have its most critical timing constraint considered when layout constraints are generated. To accomplish this, if at step 406 the cover_nets option is selected, the layout constraint generation module 318 will generate a set of all driver pins in the netlist for further processing. This set of pins is extracted from the netlist data structure 312 using netlist access routines 314.

It will be readily appreciated by those of ordinary skill in the art that aspects of the present invention may be used to identify critical paths through circuit elements other than pins and pin pairs defining net segments. Where desirable, other circuit elements could be used to identify the critical paths from which layout constraints will be generated. For instance, aspects of the present invention may be used to select the most critical path(s) through leaf cell instances or nets in a netlist. In addition, the most critical path(s) through a selected group of leaf cell instances and nets may be identified. This may be desirable when hierarchical cells are defined which include other cell instances and nets. For instance, using a method analogous to the cover_design option of the first embodiment, each driver to load pin pair defining a net segment connecting hierarchical cells could be constrained. Alternatively, using a method analogous to the cover_nets option of the first embodiment, each driver pin on a net connecting hierarchical cells could be constrained. Applying aspects of the present invention in this manner may be particularly useful when it is desirable to optimize the layout of hierarchical cells without affecting the layout of cells and nets contained within the hierarchical cells.

As shown at step 408 in FIG. 4, the layout constraint generation module 318 then identifies the most critical path through each of the cell instance pins or pin pairs identified at step 406. This may be accomplished by accessing the cell instance pin in the netlist data structure and traversing the netlist data structure forward to a path endpoint (such as an output port or input pin to a storage device) and backward to a path startpoint (such as an input port or output pin of a storage device) to find the most critical path. For pin pairs (which are considered with the cover_design option) the most critical path is determined by traversing forward from the load pin in the pair to a path endpoint and backward from the driver pin in the pair to a path startpoint.

The system of the first embodiment first examines static timing information to determine the slack for the most critical path through the specified pin or pin pair. Then the system traverses the netlist data structure. At each juncture in the netlist data structure, the associated static timing information is examined to determine which branch of the juncture should be followed for the most critical path. In the first embodiment, the branch to be followed is determined by examining the slack for each possible branch. The branch having slack corresponding to that found at the specified pin or pin pair lies on the most critical path and is followed. In the first embodiment, a query routine in the netlist access routines 314 is used to determine the most critical path for a given pin or pin pair, although it will be readily understood that the layout constraints generation module could also traverse the netlist data structure directly.

At step 410, the layout constraint generation module 318 then discards any of the identified paths that do not meet filter criteria which may be optionally provided in the mode control input. For instance, a "maximum path slack" filter condition may be set in the mode control input. As discussed previously, slack is the amount of extra time that may be used by a path or path segment before a timing constraint is violated. Slack may also be negative if a timing constraint is exceeded. To reduce the number of paths that must be considered by the target layout tool, if the "maximum path slack" filter is set, only paths having less than a certain maximum slack will be considered when generating layout constraints. In this way, the system allows paths that do not have critical constraints to be discarded.

At step 412, the layout constraint generation module 318 prioritizes the remaining paths based upon their respective slack and discards any duplicate paths. There may be some duplicate paths, since the most critical path for one pin or pin pair may also be the most critical path for another pin or pin pair. The remaining set of paths is then provided to the output formatting module 320 for further processing.

At step 414, the output formatting module 320 extracts and formats layout constraints from the remaining set of paths as is most appropriate for the target layout tool. The type and format of layout constraints may be selected by the mode control input if more than one type and format of layout constraints need to be supported. It will be understood that conventional formatting techniques may be used by the output formatting module 320. However, the set of paths used to generate the layout constraints is limited by the cover_design or cover_nets option. The output formatting module 320 outputs a set of formatted layout constraints 306 for use by a target layout tool. The formatted layout constraints 306 may be in any variety of known formats. For instance, the formatted layout constraints 306 may generate path-based constraints in SDF format. While the first embodiment of the present invention is most advantageous when used to generate path-based constraints, wire-based constraints may also be extracted from the selected subset of paths and provided to the target layout tool in any variety of formats. Other types and formats of layout constraints may readily be supported by simply extracting the constraints from the subset of paths selected by the system of the first embodiment. In particular, if a layout tool is integrated with the system of the first embodiment, the layout constraints may be provided by simply passing a data structure containing the subset of paths identified by the layout constraint generation module 318.

Specific Operation

In order to illustrate aspects of the first embodiment, the format and content of the inputs 302, 304, 308 and 310 to the system 300 will now be described in further detail. It will be readily apparent, however, that any variety of input formats may be used, and the content of the inputs will vary among circuit designs and applications.

The circuit design to be processed is specified in a design netlist 302 which is provided to the system 300. As is known in the art, a netlist is formatted data in a file or a data structure in memory representing a circuit design. The netlist may be provided in a standard file format such as Electronic Design Interchange Format (EDIF) or Verilog format. If the netlist is provided in such a file, the file will be parsed and information about the netlist will be loaded into a netlist data structure 312 in memory 208. The netlist data structure 312 associates the various pieces of information about the circuit design in memory 208 so that they may be readily processed by the system 300 executing on CPU 202. As an alternative to parsing the netlist information, another automated circuit design tool, such as a synthesis tool, may construct a netlist data structure and provide it directly to the system 300.

A technology library 308 is used in conjunction with the design netlist 302. The technology library 308 contains information about the basic blocks, called leaf cells, that are used to make up the circuit. Examples of leaf cells include, without limitation, AND gates, OR gates, invertors, flip-flops, latches, RAMs, shift registers and the like. Semiconductor vendors and designers typically provide such libraries for their products or designs. The libraries may contain information such as the pin configuration for the leaf cell and the propagation delay through the cell for both rising and falling signal transitions. Both estimated and worst case delays may be provided. Rather than repeating this information in the netlist 302, the information is stored once in the library 308 for each leaf cell. When a leaf cell is used in a netlist, a cell instance is created and information is stored regarding its connections in the circuit. The cell instance in the netlist references the leaf cell in the library 308 for information about the structure and behavior of the leaf cell. For example, while there may be several cell instances of a NAND gate in a netlist each having different connections, the information common to all of the NAND gates (such as the number of pins and timing behavior) will be stored only once in library 308. This common information will merely be referenced in the netlist.

Figure 5A:
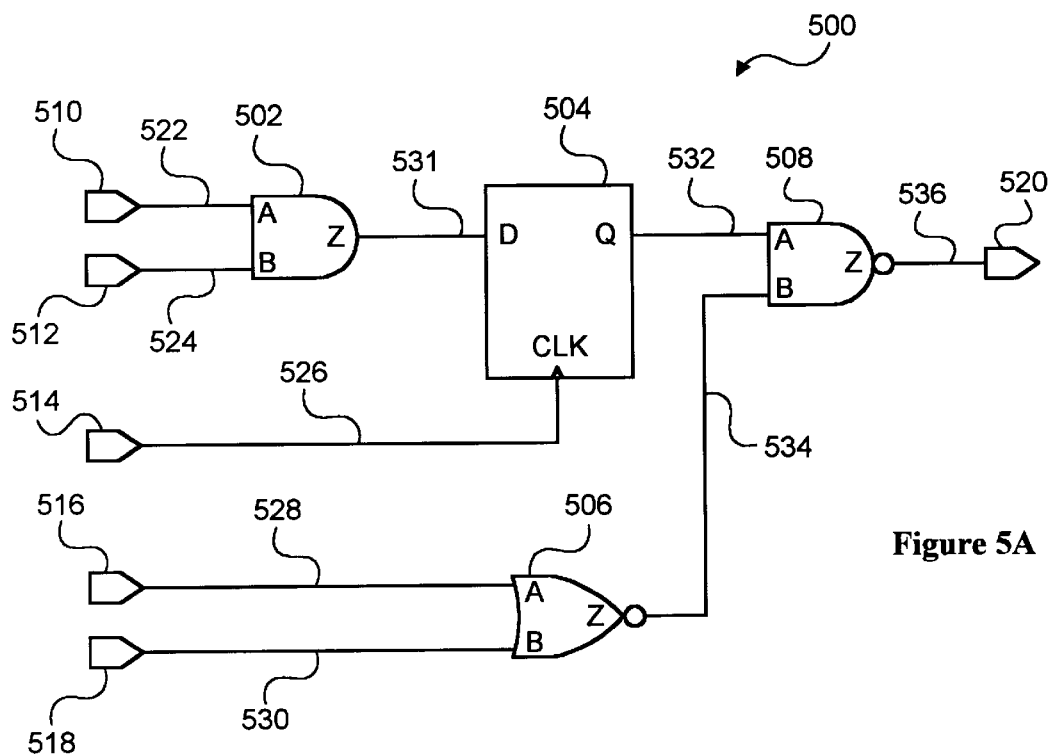
FIG. 5A is a schematic diagram illustrating a sample circuit design whose netlist may be processed by the system of the first embodiment.
Figure 5B:
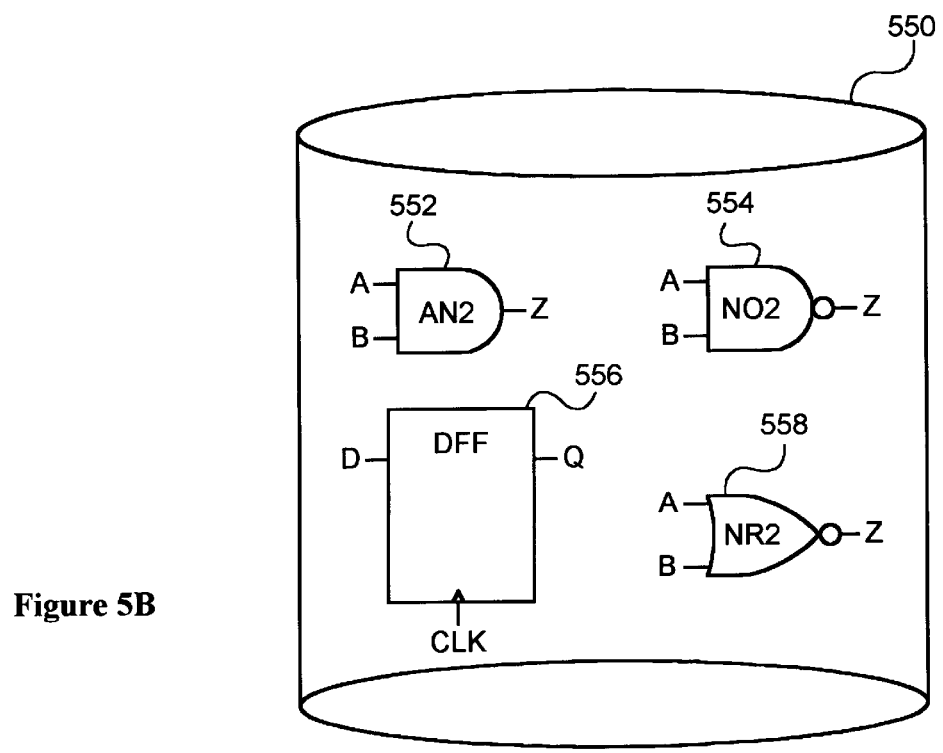
FIG. 5B is a block diagram illustrating a technology library which may be used in conjunction with the sample circuit design of FIG. 5A.

FIG. 5A is a schematic diagram of a sample circuit design, generally indicated at 500, which will be used to illustrate various aspects of the design netlist 302 and netlist data structure 312 of the first embodiment. FIG. 5B is a simplified block diagram illustrating a technology library, generally indicated at 550 which may be used in conjunction with the sample circuit design of FIG. 5A. Referring to FIG. 5B, there are four leaf cells included in the exemplary library 550—an AND gate 552, a NAND gate 554, a D-type flip-flop 556, and a NOR gate 558. Referring to FIG. 5A, the circuit design 500 contains a single cell instance of each leaf cell in library 550 (although the circuit design may contain multiple cell instances for a single leaf cell). Cell instance 502 represents an AND gate in the circuit design 500 and corresponds to leaf cell 552; cell instance 504 represents a D-type flip-flop in the circuit design 500 and corresponds to leaf cell 556; cell instance 506 represents a NOR gate in the circuit design 500 and corresponds to leaf cell 558; and cell instance 508 represents a NAND gate in the circuit design 500 and corresponds to leaf cell 554. The circuit design 500 also includes input ports 510, 512, 514, 516 and 518 and output port 520. Input and output ports have a simple structure with a single pin, and are not typically included in technology libraries provided by semiconductor vendors. However, equivalent library data structures are created for these ports by the system of the first embodiment when the technology library is loaded. The ports are modeled as cell instances in the first embodiment and reference library data structures internal to the system. The circuit design 500 also includes nets 522, 524, 526, 528, 530, 531, 532, 534 and 536. The nets represent conductive interconnects between cell instances and/or I/O ports. When a circuit design is implemented, the nets may simply be a metal interconnect layer in an integrated circuit device, connected to combinational logic cells, storage cells, and/or I/O ports at the desired locations.

Figure 6A:
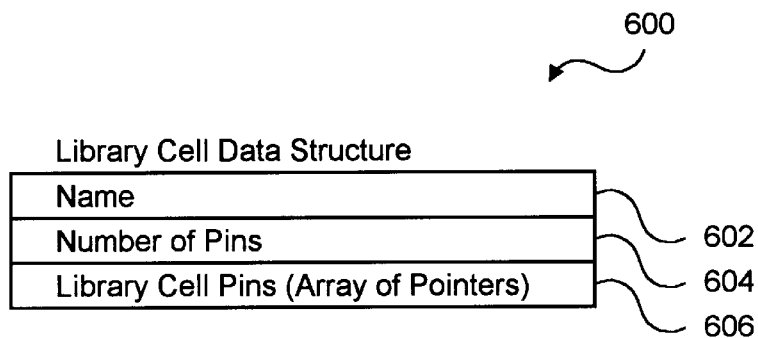
FIGS. 6A–6D illustrate library data structures for storing and organizing circuit design data in a memory according to the first embodiment.

FIGS. 6A–6D illustrate the structure of library data structures used to store leaf cell information in the system 300 according to the first embodiment of the present invention. In the first embodiment, the technology library 550 is loaded into data structures in memory 208 for associating and storing information about leaf cells. The information may be parsed from a standard library file from a semiconductor vendor or designer, or it may be constructed and provided directly by another automated design tool, such as a circuit synthesis tool. FIG. 6A illustrates a library cell data structure 600 for storing information about a leaf cell in memory 208 according to the first embodiment. The library cell data structure contains a name field 602 for storing the name of the leaf cell, a number of pins field 604 for storing the number of pins on the leaf cell, and a library cell pins field 606 for storing an array of pointers to library cell pin data structures (described further below) for storing information about the pins on the leaf cell. The number of records in the array will correspond to the number of pins on the leaf cell as stored in number of pins field 604. Referring to FIG. 5A, the leaf cells 552, 554, 556 and 558 in library 550 would each correspond to a library cell data structure 600 containing information about the respective leaf cell. For instance, AND gate 552 may be assigned a name "AN2" which would be stored in the name field 602 of a corresponding library cell data structure, number of pins field 604 would contain the number "3" since that is the number of pins on the AND gate 552, and an array of three library cell pin data structures (discussed further below) would be associated in memory with the library cell data structure through the library cell pins field 606.

Figure 6B:
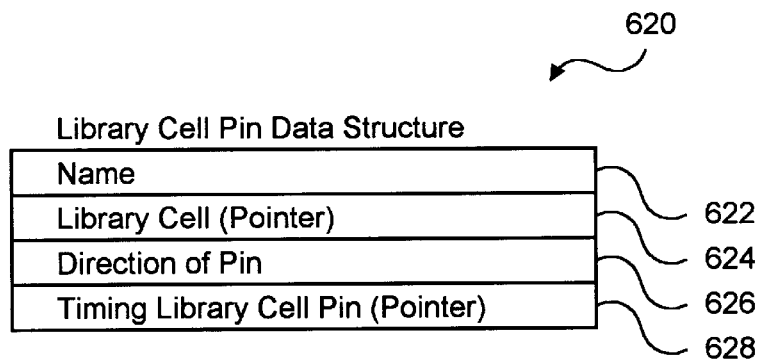

FIG. 6B illustrates a library cell pin data structure 620 for storing and organizing information about pins on a library cell in memory according to the first embodiment. The library cell pin data structure 620 contains a name field 622 for storing the name of the pin, a library cell field 624 for a pointer to the library cell data structure 600 for the leaf cell on which the pin resides, a direction field 626 for storing an indication of whether the pin is an input pin, output pin, or bidirectional pin, and a timing library cell pin field 628 for a pointer to a timing library cell pin data structure (discussed further below) which contains timing information about the leaf cell. For instance, AND gate 552 would have three library cell pin data structures 620 associated with its library cell data structure 600, one for each of pins A, B, and Z. The name of the pins (A, B, or Z) would be stored in name field 622, a pointer to a library cell data structure 600 for AND gate 552 would be stored in library cell field 624, the direction of each pin (input for A, input for B, and output for Z) would be stored in direction field 626, and a pointer to a timing library cell pin data structure (discussed further below) would be stored in timing library cell pin field 628.

Figure 6C:
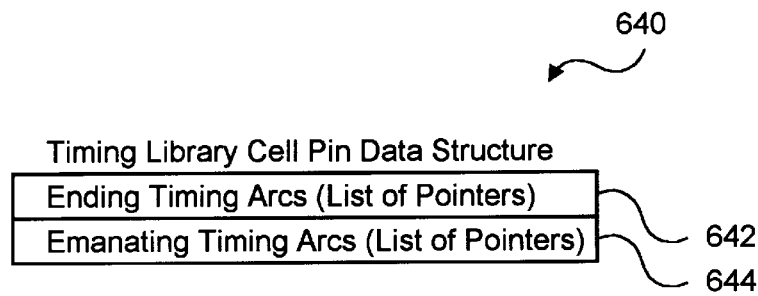

FIG. 6C illustrates a timing library cell pin data structure 640 for storing and organizing timing information about a leaf cell in memory according to the first embodiment. The timing library cell pin data structure 640 contains an ending timing arcs field 642 for storing a list of pointers to timing arc data structures (described further below) for timing arcs ending at the pin, and an emanating timing arcs field 644 for storing a list of pointers to timing arc data structures (described further below) for timing arcs emanating from the pin. A timing arc represents a signal path through the leaf cell from one pin to another. For instance, for AND gate 552 there are two timing arcs, one from input pin A to output pin Z and one from input pin B to output pin Z. The timing library pin data structure 640 for pins A and B would each have a list of one timing arc data structure for the timing arc emanating from the respective input pin to pin Z. The timing library cell pin data structure 640 for pin Z would have a list of two timing arc data structures for the two timing arcs ending at pin Z.

Figure 6D:
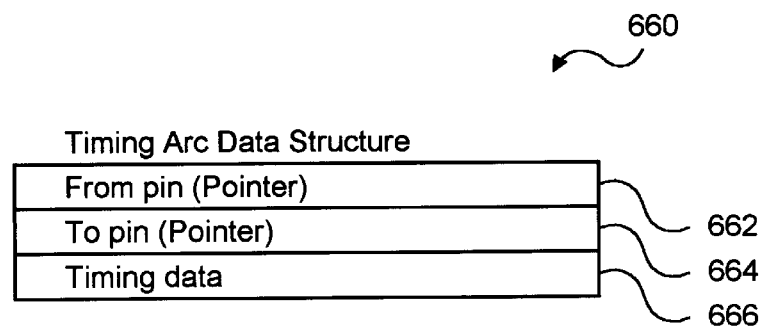

FIG. 6D illustrates the structure of a timing arc data structure 660 for storing and organizing information about timing arcs in memory according to the first embodiment. The timing arc data structure 660 contains a "from pin" field 662 for storing a pointer to the cell instance pin data structure for the pin from which the timing arc emanates, a "to pin" field 664 for storing a pointer to the cell instance pin data structure for the pin at which the timing arc ends, and a timing data field 666 containing data necessary to calculate delays along the timing arc. The data stored in the timing data field 666 can vary widely depending upon the modeling approach that is used. For instance, estimated and worst case delay information may be stored for both rising and falling signal transitions. It should be understood that aspects of the present invention may be applicable regardless of the specific modeling approach that is used. In addition, information is stored regarding the effect that the cell has upon a signal that passes through the arc. In particular, information indicating whether a rising signal transition is inverted to a falling signal transition (and conversely) is included. For instance, an arc through an invertor gate will change the type of signal from rising to falling and conversely. An arc through an AND gate, however, will not change the type of signal, and an arc through an XOR gate may conditionally change the type of signal transition.

Figure 7A:
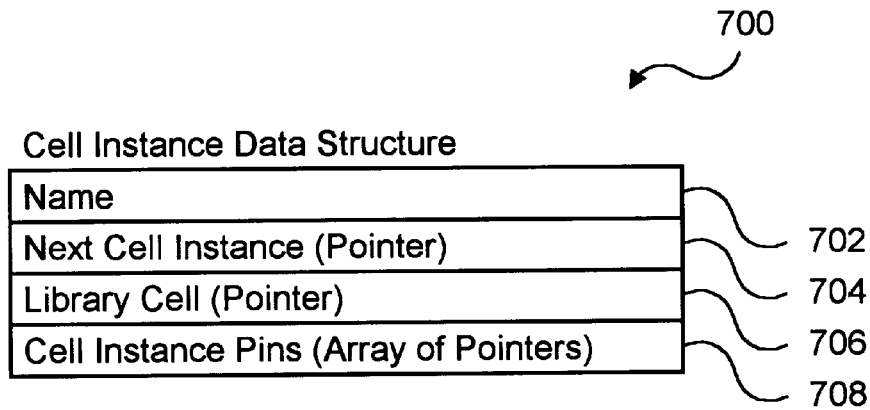
FIGS. 7A–7D illustrate netlist data structures for storing and organizing circuit design data for a netlist in a memory according to the first embodiment.

FIGS. 7A–7D illustrate the netlist data structure 312 used to store and organize circuit design information in memory according to the first embodiment of the present invention. The information stored in the netlist data structure 312 may be parsed from a standard netlist file (such as an EDIF or Verilog file) or it may be constructed and provided directly by another automated design tool, such as a circuit synthesis tool. In addition, certain timing and other information that may be stored in the netlist data structure 312 may be generated internally by system 300. FIG. 7A illustrates a cell instance data structure 700 for storing and organizing information about cell instances in a netlist according to the first embodiment. The cell instance data structure 700 contains a name field 702 for storing the name of the cell instance, a next cell instance field 704 for a pointer to the next cell in the netlist (this provides a linked list of all cell instances in the netlist), a library cell field 706 for a pointer to a library cell data structure 600 for the cell (discussed above), and a cell instance pins field 708 for an array of pointers to cell instance pin data structures (discussed further below) for storing information about each pin of the cell instance. For the circuit design of FIG. 5A, each cell instance 502, 504, 506 and 508 would have a corresponding cell instance data structure 700. For instance, cell instance 502 would have a cell instance data structure 700. The name field 702 would contain a name, such as "502", the next cell instance field 704 would contain a pointer to the next cell instance data structure, which could be, for example, the cell instance data structure for cell instance 504 (the next cell pointer provides a linked list of cell instances and the order is not critical—it may be determined based on the order of loading the netlist data structure), library cell field 706 would contain a pointer to the library cell data structure 600 for the leaf cell AND gate 552, and cell instance pins field 708 would contain an array of pointers to three cell instance pin data structures (discussed further below), one for each pin (A, B, and Z) of the cell instance 502. In the first embodiment, information for each input, output, and bidirectional port is also stored in a cell instance data structure.

Figure 7B:
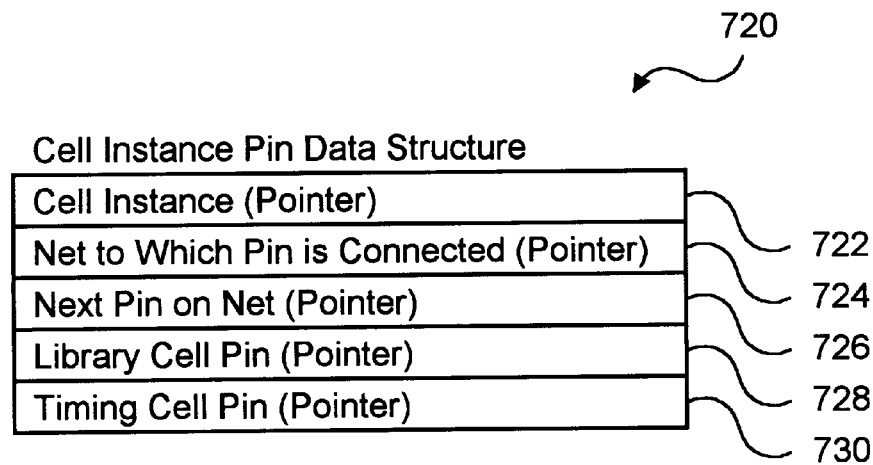

FIG. 7B illustrates a cell instance pin data structure 720 for storing and organizing information about a pin of a cell instance in memory according to a first embodiment of the present invention. The cell instance pin data structure 720 contains a cell instance field 722 for a pointer to the corresponding cell instance data structure 700, a net field 724 for a pointer to a net data structure (discussed further below) containing information about the net to which the pin is connected, a next pin on net field 726 for a pointer to a cell instance data structure 720 for the next pin connected to the same net (which has the effect of providing a linked list of pins on the net), a library cell pin field 728 for a pointer to a library cell pin data structure 620 for the pin on the leaf cell corresponding to the pin on the cell instance, and a timing cell pin field 730 for a pointer to a timing cell pin data structure (discussed further below) for storing timing information for the pin. For example, cell instance 502 would have three associated cell instance pin data structures (one for each pin A, B and Z). Cell instance field 722 would contain a pointer to the cell instance data structure 700 for cell instance 502, net field 724 would contain a pointer to a net data structure for net 522 for pin A, net 524 for pin B, and net 531 for pin Z, next pin on net field 726 would contain a pointer to a cell instance pin data structure 720 for the next pin (of the same direction type as this pin) on the same net, library cell pin field 728 would contain a pointer to the respective library cell pin data structure for the pin, and timing cell pin field 730 would contain a pointer to a timing cell pin data structure (discussed further below). Input and output ports also have cell instance pin data structures 720.

Figure 7C:
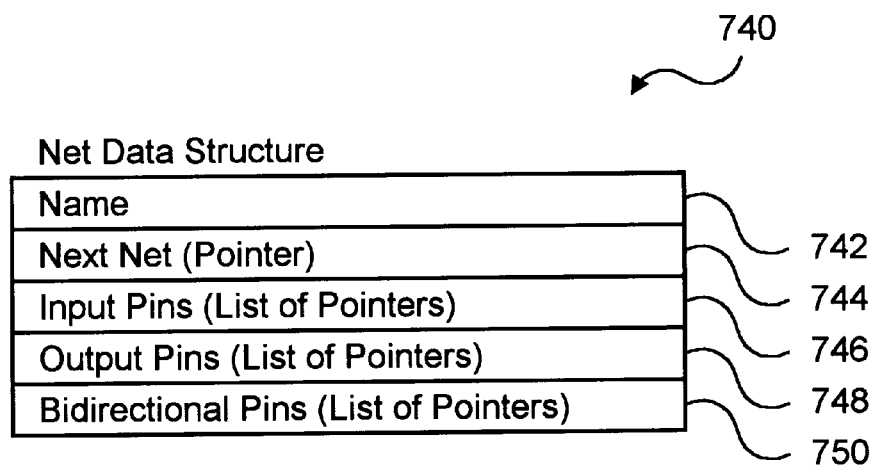

FIG. 7C illustrates a net data structure 740 for storing and organizing information about a net in memory according to the first embodiment. The net data structure 740 contains a name field 742 for storing the name of the net, a next net field 744 for a pointer to the next net in the netlist (which provides a linked list of nets for the entire netlist), an input pins field 746 for a linked list of pointers to cell instance pin data structures for all input pins on the net, an output pins field 748 for a linked list of pointers to cell instance pin data structures for all output pins on the net, and a bidirectional pins field 750 for a linked list of pointers to cell instance pin data structures for all bidirectional pins on the net. For the circuit design of FIG. 5A, a net data structure 740 would be associated with each net 522-536 in the circuit. For instance, net 531 would have a net data structure 740 with a name such as "531" in name field 742, a pointer to the next net data structure (which may be for net 532) in next net field 744, a pointer to the cell instance pin data structure for pin D of flip-flop 504 in input pins field 746, a pointer to the cell instance pin data structure for pin Z of AND gate 502 in output pins field 748, and a null list in bidirectional pins field 750.

Figure 7D:
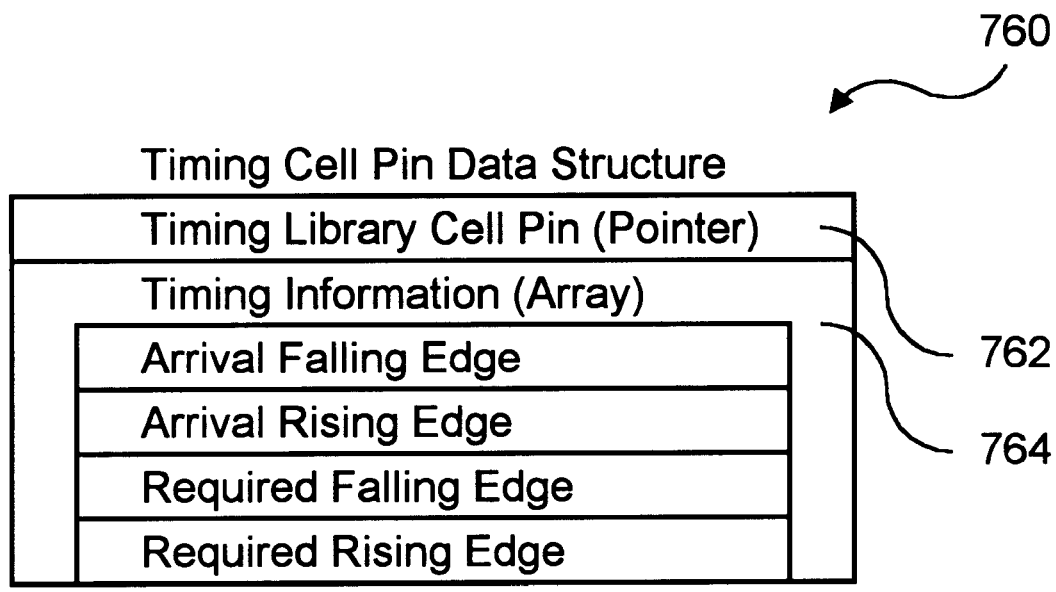

FIG. 7D illustrates a timing cell pin data structure 760 for storing and organizing timing information related to a pin in memory according to the first embodiment. As will be discussed below, the timing information contained in a timing cell pin data structure 760 is generated by system 300 using static timing analysis techniques and is not parsed directly out of a standard netlist file. The timing cell pin data structure 760 contains a timing library cell pin field 762 containing a pointer to the corresponding timing library cell pin data structure 640, and a timing information field 764 containing an array of timing information for the pin which will be discussed further below.

After information from the design netlist 302 is loaded into the netlist data structure 312, the static timing analysis module 316 can perform static timing analysis and associate timing information with the netlist data structure 312 through the timing cell pin data structure 760 described above. The processing performed by the static timing analysis module 316 of the first embodiment will now be described in further detail to illustrate the type and structure of information that is provided to the layout constraint generation module 318. However, it will be readily understood by those of ordinary skill in the art that the static timing information may be generated using many different algorithms and methods known in the art. (See, e.g., James J. Vorgert, "Quantify critical-timing risks with statistical analysis", Electronic Design News at 95, Feb. 17, 1994).

The processing performed by the static timing analysis module 316 will now be discussed within the context of the sample circuit design of FIG. 5. A variety of static timing analysis techniques are known in the art and may be used in conjunction with the present invention. What is desired for the first embodiment is that the static timing analysis module 316 calculate timing information at each pin of the circuit and associate this information in memory with the appropriate location in the netlist for that circuit. In the first embodiment, this timing information is stored in timing information field 764 of the timing cell pin data structure 760 for each cell instance pin of the netlist data structure. The timing information preferably includes the calculated arrival time for a signal to reach that pin in the circuit, and the calculated required time within which a signal must reach that pin to satisfy the timing constraints for the circuit. These arrival and required times may be calculated and stored at each pin for both rising and falling edge signal transitions.

More than one arrival time may be calculated for a pin, since rising and falling edge signal transitions may propagate through the circuit at a different rate. The first embodiment currently uses the maximum arrival time at a given pin, since most layout tools are concerned primarily with not violating the maximum timing requirements for a path. It is also possible to consider minimum arrival times to avoid violating minimum timing constraints for a path. Minimum timing constraints are a concern when a signal should not reach a pin in the circuit any earlier than a specified time. It will be readily apparent to those of ordinary skill in the art, that aspects of the present invention may be applied to minimum timing constraints as well as maximum timing constraints. The most critical path for each pin or pin pair would still be used to generate layout constraints, but the most critical path would be defined as the path having the most slack. If both minimum and maximum timing constraints are used to generate layout constraints, two paths may be considered for each pin or pin pair—the path violating the minimum timing constraint by the greatest margin (or the path coming closest to violating the minimum timing constraint if no path violates a minimum timing constraint) and the path violating the maximum timing constraint by the greatest margin (or the path coming closest to violating the maximum timing constraint if no path violates a maximum timing constraint). These paths would be the paths through the pin or pin pair having the most and least slack respectively. If both minimum and maximum constraints are considered, eight values may be stored for each pin: minimum and maximum arrival times for both rising and falling edge signal transitions, and minimum and maximum required times for both rising and falling edge signal transitions.

Arrival times may be calculated by starting at each endpoint in the netlist data structure and traversing backward to recursively compute the maximum (and optionally minimum) arrival time at each output pin encountered in the transitive fanin of this endpoint. For purposes hereof, an endpoint is any output or bidirectional port represented in the netlist data structure for the circuit design, or any input or bidirectional pin to a storage element represented in the netlist data structure, such as a flip-flop, latch, or the like. For instance, the endpoints in the sample circuit design of FIG. 5A are output port 520 and input pin D to flip-flop 504.

In order to calculate the arrival time for input pin D to flip-flop 504, the static timing analysis module 316 would start with that pin's cell instance pin data structure 720 and traverse backwards through the netlist data structure. To traverse backwards, the static timing analysis module 316 may access the net data structure 740 for the net to which the pin is attached through net field 724. To traverse backwards through a cell instance in the netlist data structure, the timing arc data structures 660 linked through the timing library cell pin data structure 640, library cell pin data structure 620, and library cell data structure 600 to the appropriate cell instance data structure 700 may be examined. The timing arc data structures 660 linked to a cell instance data structure 700 indicate which pin combinations may provide a signal path through the cell.

For the input pin D to flip-flop 504, the static timing analysis module 316 would traverse backwards and recursively compute the maximum (and optionally minimum) arrival time at each output pin encountered in the transitive fanin of this endpoint. First, the static timing analysis module 316 would traverse backward and determine that the arrival time at output pin Z of AND gate 502 must be calculated. Then the static timing analysis module 316 would recursively traverse backward through the timing arcs for AND gate 502 and determine that the arrival times for input ports 510 and 512 must be calculated. Since the arrival times for input ports 510 and 512 are given, the static timing analysis module 316 may start exiting the recursion. It should be noted that the arrival time for startpoints (that is, input or bidirectional parts or output or bidirectional pins on a storage element) are given or assumed to be zero. To calculate the arrival time at output pin Z for AND gate 502, the delay associated with net 522 and the timing arc from input pin A of AND gate 502 to the output pin Z of AND gate 502 are added to the arrival time for input port 510. Similarly, the delay associated with net 524 and the timing arc from input pin B of AND gate 502 to the output pin Z of AND gate 502 are added to the arrival time for input port 512. As the static timing analysis module 316 exits the recursion, the maximum arrival time at each pin may be stored in the respective timing cell pin data structure 760. For output pin Z of AND gate 502, the maximum of the arrival times across the timing arcs from input pin A to output pin Z and from input pin B to output pin Z would be stored. The maximum arrival time for input pin D to flip-flop 504 would simply be the maximum arrival time at output pin Z of AND gate 502 plus the delay associated with net 531.

Once all the arrival times are calculated and stored, a second recursive pass is made through the netlist data structure to compute required times. Required times are calculated by traversing forward through the netlist data structure and recursively calculating the maximum (and optionally minimum) required times for each input pin encountered in the transitive fanout of the startpoint. For purposes hereof, a startpoint is any input or bidirectional port represented in the netlist data structure for the circuit design, or any output or bidirectional pin on a storage element represented in the netlist data structure, such as a flip-flop, latch, or the like. For instance, the startpoints in the sample circuit design of FIG. 5A are input ports 510, 512, 514, 516, and 518 and output pin Q on flip-flop 504.

The required times for endpoints may be given or may be calculated based on the clocking scheme for a netlist. For instance, a 50 MHz clocking scheme implies that the propagation time between two commonly clocked flip-flops may not exceed 20 nanoseconds (ns), hence there is a 20 ns required time at the input pin of the second flip-flop. To calculate required times, the static timing analysis module 316 starts at each startpoint and traverses forward until a known required time is encountered. Then the static timing analysis module 316 recurses backward, calculating and storing the required time at each pin. To calculate the required time, the delay associated with nets and cell instances is subtracted from the known required time at the endpoint. At each pin, the most restrictive required time is stored. This is called the maximum required time even though it is shortest length of time in which a signal is required at a pin, since the value is used for evaluating maximum timing constraints.

It will be readily apparent to those skilled in the art that bidirectional pins may have different arrival and required times depending upon whether they are acting as driver or load pins. Therefore, separate arrival and required times may be calculated and stored in timing information field 764 for each case—a first pair of arrival and required times will be stored for the bidirectional pin when it acts as a driver pin and a second pair of arrival and required times will be stored for the bidirectional pin when it acts as a load pin. As is known in the art, when traversing a netlist data structure that includes bidirectional pins, a static timing analysis module may set state variables to keep track of where bidirectional pins are acting as loads or drivers for the current pass through the netlist. Each of the states for the bidirectional pins will be considered in order to calculate all of the arrival and required times.

The above described static timing analysis is only one example of a static timing analysis method that may be used in conjunction with aspects of the present invention. What is desired for the first embodiment is that timing information for determining the most critical path through each pin be calculated. Preferably, this includes timing information for determining "slack", which is the required time minus the arrival time at a given pin (or other circuit element). Slack may be negative. It should be noted that an arrival time at a given pin contains information about the worst delay in the circuit up to that pin, and a required time contains information regarding the strictest required time from that point forward in the circuit. Slack takes both of these values into account.

Additional arrival times and required times may also have to be calculated and stored for pins in the netlist data structure. In the first embodiment, the timing information stored in timing information field 764 of the timing cell pin data structure 760, may comprise an array of arrival and required times for the cell instance pin. Each entry in the array is referred to as a "slot" and may contain eight values to represent the maximum and minimum arrival and required times for both rising and falling edge signals.

Different slots in the first embodiment are desirable to account for multiple clocking schemes or timing constraints. The use of slots will be described with reference to FIGS. 8A, 8B and 8C.

Figure 8A:
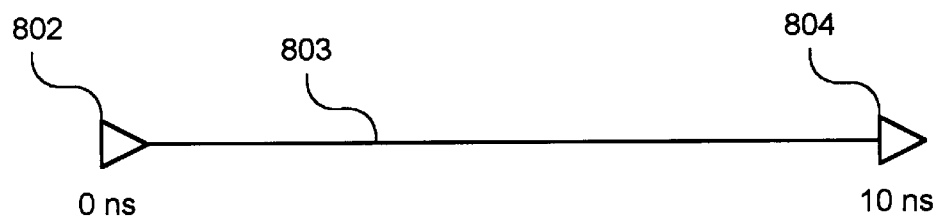
FIGS. 8A–8C illustrate sample circuit designs which illustrate the use of slots according to the first embodiment.

FIG. 8A illustrates a circuit design having a single input port 802, a single net 803, and a single output port 804. If a timing constraint of 10 ns is specified, the arrival time at input port 802 will default to zero and the required time for output port 804 will be 10 ns.

Figure 8B:
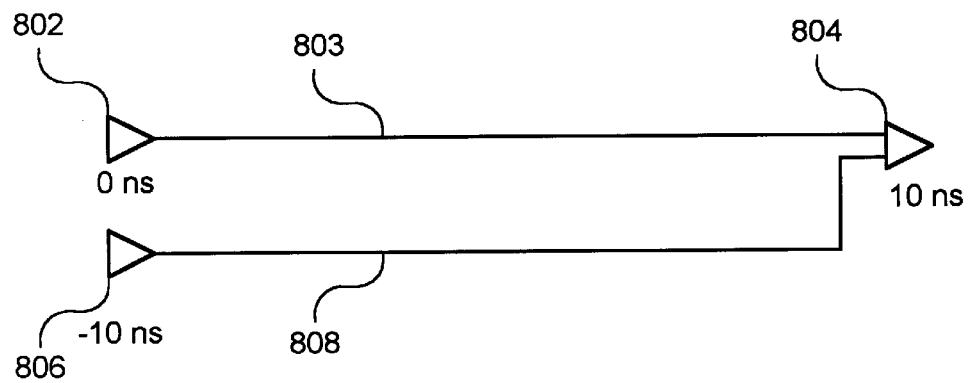

FIG. 8B illustrates the circuit design of FIG. 8A with an additional input port 806, and an additional net 808 connecting input port 806 to output port 804. If the timing constraint specified between input port 806 and output port 804 is 20 ns, this may be accommodated by setting the arrival time on input port 806 to −10 ns. This remains consistent with the values already specified for input port 802 and output port 804.

Figure 8C:
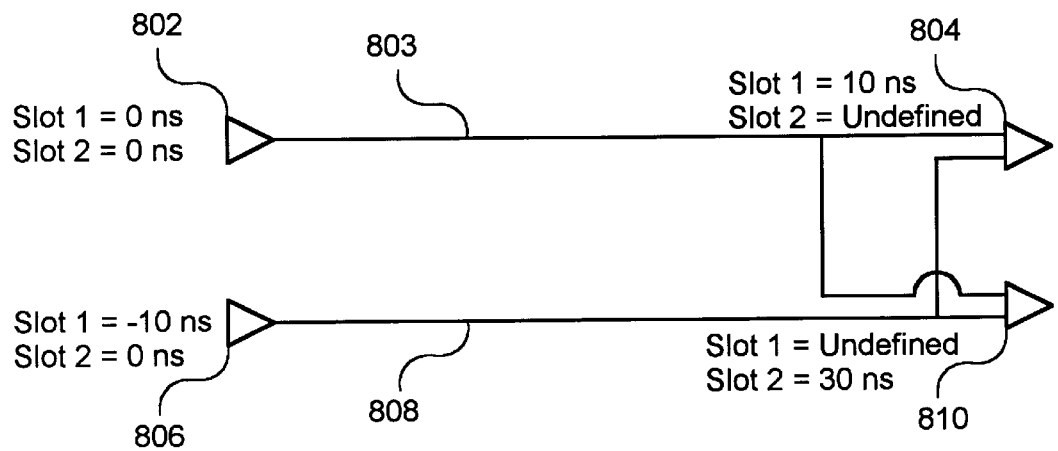

FIG. 8C illustrates the circuit design of FIG. 8B with an additional output port 810 added to nets 803 and 808. If a timing constraint of 30 ns is specified between both input ports 802 and 806 and output port 810, no required time may be set for output port 810 that is consistent with all other timing constraints. To accommodate such timing constraints, a new slot may be allocated. The first entry in the array of timing information field 764 (the first slot) of the timing cell pin data structures 760 for input ports 802 and 806 would contain arrival and required times based upon the timing constraints relative to output port 804. A second entry in array of timing information field 764 (the second slot for input ports 802 and 806) would contain arrival and required times based upon the timing constraints relative to output port 810. For instance, slot 1 would contain arrival times of 0 ns and −10 ns for input ports 802 and 806 respectively, and a required time of 10 ns for output port 804. Slot 1 would be undefined for output port 810 since no consistent required time may be assigned. Slot 2 would contain arrival times of 0 ns for both input port 802 and input port 806, and a required time of 30 ns at output port 810. Slot 2 would be undefined for output port 804. Thus, multiple timing constraints may be accommodated in the first embodiment by allocating a new slot each time a timing constraint is encountered that cannot be consistently handled within existing slots.

Once the required and arrival times at each pin are determined for each slot, the netlist data structure may be queried through netlist access routines 314 regarding the most critical paths through the circuit design represented in the netlist data structure. The most critical path (assuming maximum timing constraints) includes the input and output pins on each net having the lowest slack. Thus, the most critical path through a pin may be determined by following the pins with the least slack at each net both backwards and forward until a startpoint and endpoint have been reached for the path. If multiple slots are used, the slot and pin with the least slack are followed to determine the most critical path. This process will be discussed in further detail below.

Figure 9:
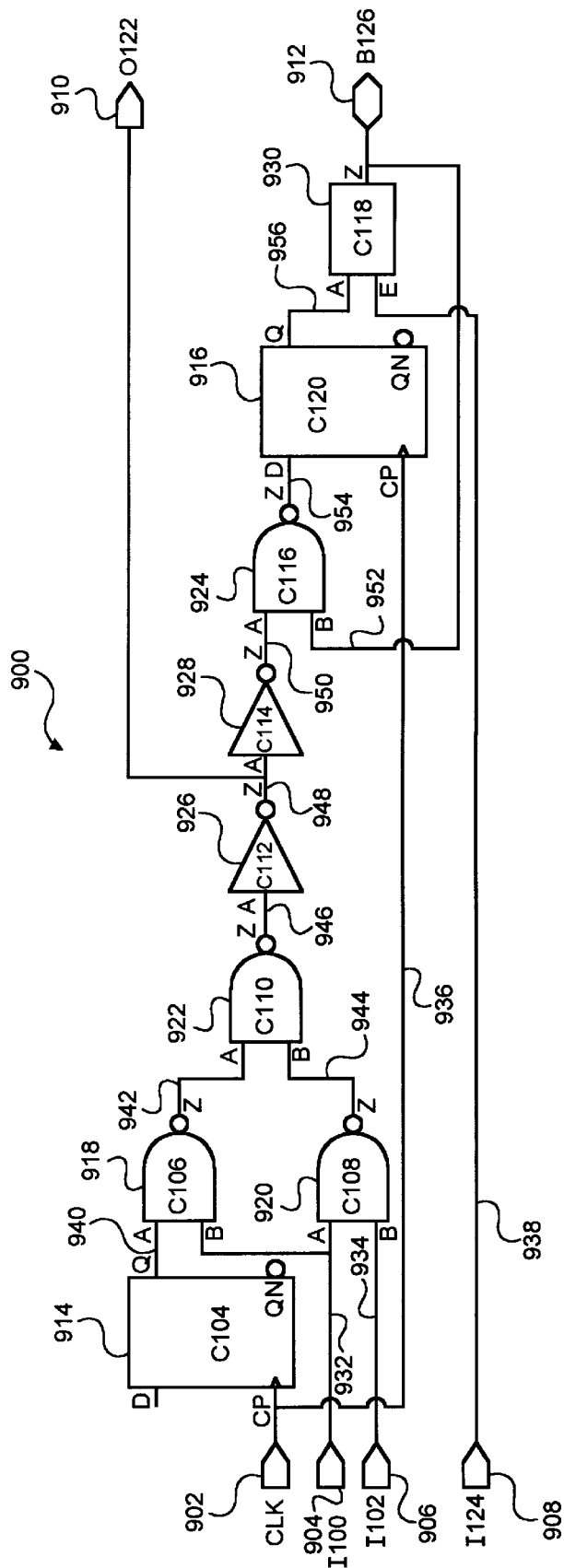
FIG. 9 is a schematic diagram illustrating a sample circuit design whose netlist may be processed by the system of the first embodiment.

The operation of the layout constraint generation module 318 and output formatting module 320 will now be described with reference to the sample circuit design shown in FIG. 9. The cell instances and ports in FIG. 9 have both names (which will be referenced herein in quotes) and reference numerals (without quotes). FIG. 9 shows a sample circuit design generally indicated at 900 having four input ports: "CLK" 902, "I100" 904, "I102" 906, and "I124" 908. The input ports each have one unnamed driver pin for connections to the nets of the circuit. The circuit design 900 also has one output port, "O122" 910. The output port has a single unnamed input pin for connections from the circuit. Circuit design 900 also includes a bidirectional input/output port "B126" 912. The bidirectional port 912 has a single unnamed bidirectional pin that is used for connections to nets of the circuit. Information for each of the above-described ports would be loaded into cell instance data structure 700 in the netlist data structure at step 402 of FIG. 4. Each cell instance data structure would reference a single cell instance pin data structure 720 for the single pin on each port.

The cell instances in the circuit design of FIG. 9 include: D-type flip-flops "C104" 914 and "C120" 916; NAND gates "C106" 918, "C108" 920, "C110" 922, and "C116" 924; invertors "C112" 926 and "C114" 928; and tri-state buffer "C118" 930. Information for each of the cell instances would be loaded into cell instance data structure 700 in the netlist data structure at step 402 of FIG. 4. Each cell instance data structure would reference a cell instance pin data structure 720 for each of its pins. Library cell data structure 600 and timing data structures 640, 660 and 760 would also be linked to each cell instance data structure as previously described with reference to FIGS. 6 and 7.

The circuit design of FIG. 9 also includes nets 932, 934, 936, 938, 940, 942, 944, 946, 948, 950, 952, 954 and 956 which connect the various cell instances and ports as shown.

After the netlist data structure 312 has been loaded with the information from the design netlist 302, the static timing analysis module 316 performs static timing analysis as shown at step 404 in FIG. 4, and as described previously with reference to the example circuit of FIG. 5. The static timing information is used to create timing data structures 640, 660 and 760 as described with reference to FIGS. 6 and 7. These timing data structures are linked to the cell instance data structure 700 in the netlist data structure as described previously.

As shown at step 406 in FIG. 4, the layout constraint generation module 318 then identifies the cell instance pins to be constrained based on the mode control input 310.

Figure 10:
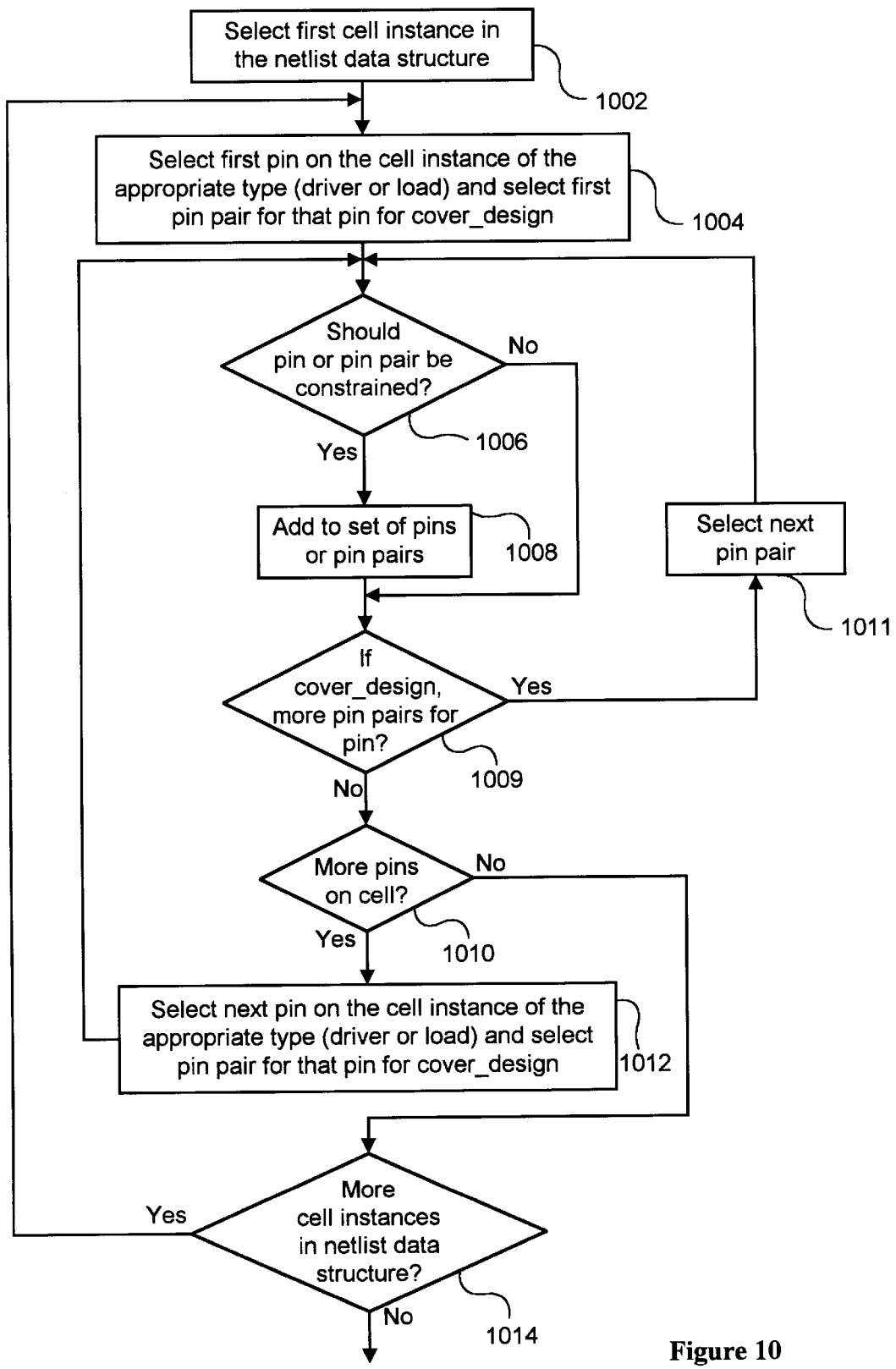
FIG. 10 is a flow chart illustrating a method for identifying circuit elements to be constrained according to the first embodiment of the present invention.

FIG. 10 is a flow chart illustrating the method for identifying cell instance pins to be constrained according to the first embodiment of the present invention. Referring to FIG. 10, at step 1002 the layout constraint generation module 318 selects the first cell instance data structure 700 in the netlist data structure 312. This may be accomplished by querying the netlist data structure using netlist access routines 314. The particular cell instance that the layout constraints generation module starts with in the first embodiment is not critical since it loops through the netlist data structure examining each cell instance. For illustrative purposes, it will be assumed that the cell instance data structure for NAND gate 922 is returned as the first cell instance.

As shown at step 1004 in FIG. 10, the layout constraint generation module 318 will then select the first pin on the cell instance of the appropriate type. If the cover_nets option is set, only driver pins will be examined. If the cover_design option has been set by mode control input 310, only load pins will be examined. The cell instance pin types are differentiated by referencing timing cell pin field 730 of the cell instance pin data structure which in turn references a library cell pin data structure 620. Direction field 626 of the appropriate library cell pin data structure 620 gives the direction of the pin. When the cover_design option is set, input and bidirectional pins will be examined and output pins will be ignored. When the cover_nets option is set, output and bidirectional pins will be examined and input pins will be ignored.

Additional processing takes place at step 1004 if the cover_design option is used. For the load pin identified at step 1004, a driver to load pin pair on the net is returned. This may be accomplished by traversing through a linked list of pins on the net (accessible through fields 748 and 750 of the net data structure for the selected load pin) until a driver pin is encountered. A pointer to the cell instance pin data structure 720 for the load pin and a pointer to the cell instance pin data structure 720 for the driver pin are associated in memory and returned as a driver to load pin pair. This driver to load pin pair defines a segment of the net to be constrained. Using driver to load pin pairs assures that each net segment in the circuit design will be considered when generating layout constraints. This is equivalent to considering only load pins unless multiple drivers are present on a net.

Since multiple drivers on a net are rare, the design of the system of the first embodiment may be simplified by considering only load pins (as opposed to driver to load pin pairs) for the cover_design option. When multiple drivers are present, however, this may leave some net segments unconstrained. Another intermediate solution is to generate a set of load pins (as opposed to driver to load pin pairs) and add driver pins to the set when multiple driver pins are present on a net. This will provide a constraint for each load pin and driver pin, but still may leave some net segments unconstrained (although only when both multiple drivers and multiple loads are present on a net). However, processing is simplified since only pins are processed and not pin pairs. Thus, the processing may be generally consistent with that performed for the cover_nets option which examines driver pins. However, to assure that all net segments are constrained, the system of the first embodiment preferably considers each unique driver to load pin pair on a net (which defines a segment of the net to be constrained).

Figure 11:
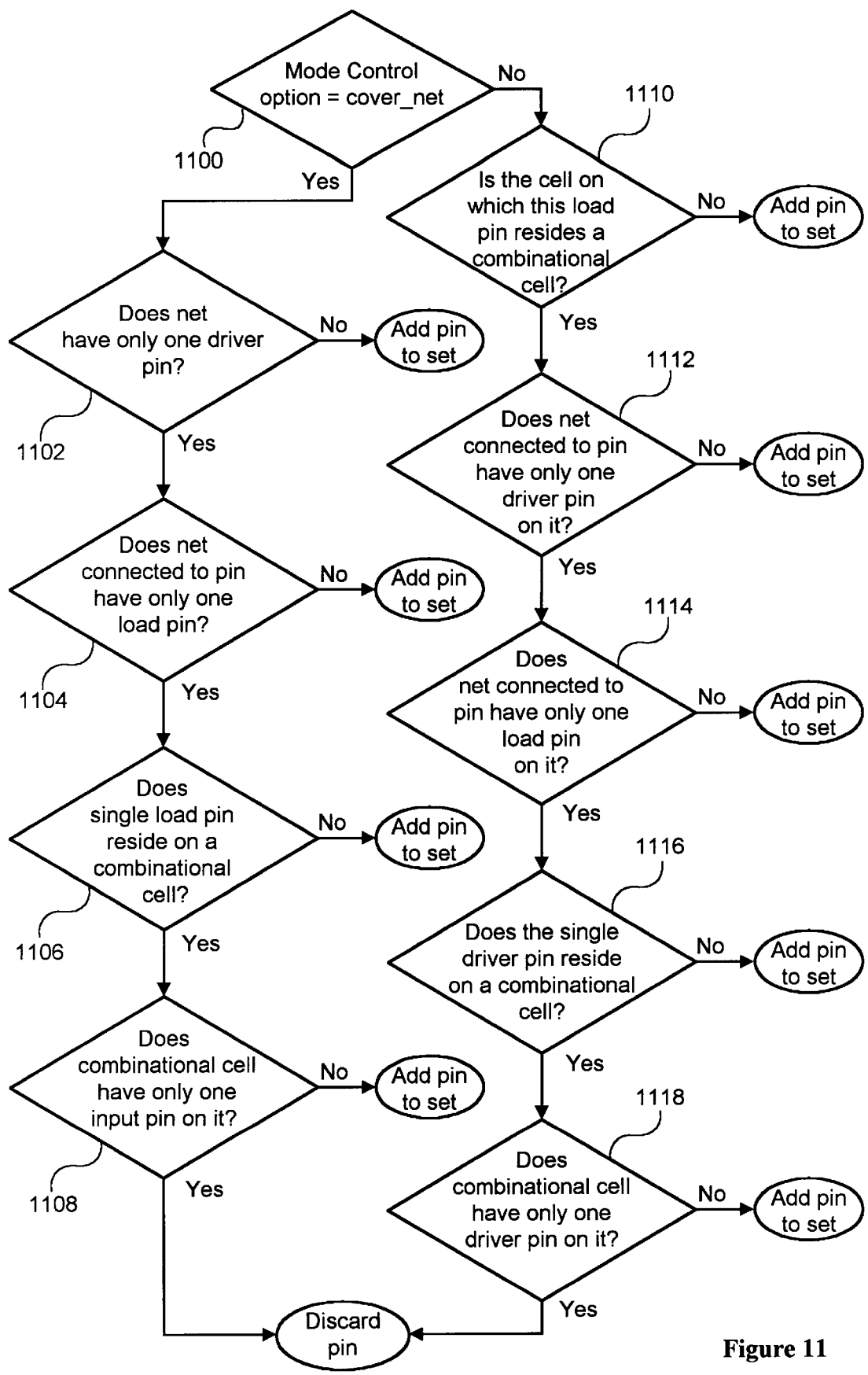
FIG. 11 is a flow chart illustrating a method for determining whether a specified circuit element should be constrained according to the first embodiment of the present invention.

After the first cell instance pin data structure (or pair) to be processed has been selected, the layout constraint generation module 318 makes an initial determination as to whether a layout constraint should be generated for the pin or pin pair. This accounts for the fact that certain pins or pin pairs are guaranteed to be covered by the worst path generated for other pins or pin pairs in the netlist. This step is shown at 1006 in FIG. 10 and is shown in additional detail in the flow chart of FIG. 11. In step 1006, the layout constraints generation module tests the selected pin against various conditions. When the cover_design option is used, the selected pin for purposes of step 1006 is the load pin in the driver to load pin pair. If all of the conditions shown in FIG. 11 are met, it is determined that generating a layout constraint for the selected pin will not provide any additional useful information for a layout tool (not covered by other pins or pin pairs) and the pin or corresponding pin pair is ignored. This helps reduce the number of redundant paths that are generated, although it will be readily apparent to those of ordinary skill in the art that embodiments of the present invention may be developed without performing this initial filtering.

The conditions that are checked in the system of the first embodiment are shown in the flow chart of FIG. 11. First, as shown at step 1100, the layout constraints generation module determines whether the cover_nets or cover_design option has been selected as specified in the mode control input 310. Different conditions are checked depending on the mode. If the cover_nets option is set, conditions shown at steps 1102, 1104, 1106 and 1108 are checked. If the cover_design option is set, conditions shown at steps 1110, 1112, 1114, 1116 and 1118 are checked relative to the load pin in the respective driver to load pin pair. If any of the conditions are not met, the pin or pin pair will be added to a set of pins or pin pairs which will be retained by the layout constraint generation module 318 for further processing. The layout constraints generation module retains pins and pin pairs in a linked list of pointers to the corresponding pins' respective cell instance pin data structures 720. If all of the conditions are met for a given pin, the pin or pin pair is discarded and the layout constraints generation module moves on to the next pin or pin pair.

As shown at steps 1102, 1104, 1106 and 1108, the following conditions are checked if the cover_nets option is set:

1. Does the net to which the pin is attached have only one driver pin? [step 1102]
2. Does the net to which the pin is attached have only one load pin? [step 1104]
3. Does the single load pin reside on a combinational cell? [step 1106]
4. Does the combinational cell from step 1106 have only one input pin on it? [step 1108]

Each of the above-described conditions may be checked by using netlist access routines 314 to traverse the netlist data structure 312. As explained with reference to FIGS. 6 and 7, the cell instance pin data structure is linked through net field 724 to a net data structure 740 for the net to which the pin is attached. The other pins on the net are accessible through fields 746, 748, and 750 of the net data structure, and these pins are in turn linked to other cell instances on the net through field 722 of their respective cell instance pin data structure 720. Therefore, data required to test the above conditions is readily accessed through the netlist data structure 312. In particular, the type of pin (load or driver) is determined by the lists of input, output and bidirectional pins in fields 746, 748, and 750 respectively of the net data structure. Pins with an input or bidirectional direction will meet conditions requiring load pins, and pins with an output or bidirectional direction will meet conditions requiring output pins.

For the sample circuit design of FIG. 9, if the cover_nets option is selected, the following driver pins will be included in the set of pins to be constrained: unnamed output pins for input ports 902, 904, 906, and 908; bidirectional pin for bidirectional port 912; output pin Q for flip-flop 914; output pin Z for NAND gate 918; output pin Z for NAND gate 920; output pin Z for invertor 926; output pin Z for invertor 928;

output pin Z for NAND gate 924; output pin Z for tri-state buffer 930; and output pin Q for flip-flop 916. Output pin Z for NAND gate 922 meets all of the conditions described above and would not be included in the set of pins to be constrained.

Using similar techniques, as shown at steps 1110, 1112, 1114, 1116 and 1118, the following conditions are checked for the selected load pin (from the driver to load pin pair) if the cover_design option is set:

1. Is the cell to which the pin is attached a combinational cell? [step 1110]
2. Does the net to which the pin is attached have only one driver pin on it? [step 1112]
3. Does the net to which the pin is attached have only one load pin on it? [step 1114]
4. Does the single driver pin on the net reside on a combinational cell? [step 1116]
5. Does the combinational cell from step 1116 have only one driver pin on it? [step 1118]

For the sample circuit design of FIG. 9, if the cover_design option is selected, the following driver to load pin pairs will be included in the set of pin pairs to be constrained: unnamed input pin for output port 910 paired with output pin Z of invertor 926; unnamed pin for bidirectional port 912 paired with output pin Z from tri-state buffer 930; input pin CP for flip-flop 914 paired with the output pin for input port 902; input pin A for NAND gate 918 paired with output pin Q for flip-flop 914; input pin B for NAND gate 918 paired with the output pin for input port 904; input pin A for NAND gate 920 paired with the output pin for input port 904; input pin B for NAND gate 920 paired with the output pin for input port 906; input pin A for invertor 928 paired with output pin Z of invertor 926; input pin B for NAND gate 924 paired with output pin Z for tri-state buffer 930; input pin B for NAND gate 924 paired with the bidirectional pin for the port 912; input pin A for tri-state buffer 930 paired with output pin Q for flip-flop 916; input pin E for tri-state buffer 930 paired with the output pin for input port 908; input pin CP for flip-flop 916 paired with the output pin for input port 902; and input pin D for flip-flop 916 paired with output pin Z of NAND gate 924. The following load pins meet all of the conditions described above with reference to FIG. 11 and would not be included in the set of pin pairs to be constrained: input pins A and B for NAND gate 922; input pin A for invertor 926; and input pin A for NAND gate 924. It should be noted that selecting only load pins, instead of driver to load pin pairs, would provide the same set of constraints except with regard to net 952 which has two potential driver pins, pin Z of tri-state buffer 930 and the bidirectional pin for port 912. If the worst path through each load pin is generated, instead of the worst path through each driver to load pin pair, one of the segments of net 952 may be unconstrained.

Referring to FIG. 10, if the layout constraint generation module 318 determines that the pin or pin pair should be constrained at step 1006, the cell instance pin data structure(s) for the pin or pin pair is added to a set of pins or pin pairs that is retained for further processing as shown at step 1008. The set of pins or pin pairs may be retained in a linked list of pointers to cell instance pin data structures. If the layout constraint generation module 318 determines that the pin or pin pair should not be constrained, step 1008 is skipped and the pin or pin pair is ignored.

At step 1009, if the cover_design option is selected, it is determined whether there are any more pin pairs for the load pin identified in step 1004. This is determined by continuing to traverse the linked list of pins on the net. If additional driver pins are found on the net, the next pin pair is selected at step 1011 and steps 1006, 1008 and 1009 are repeated until there are no more driver to load pin pairs on the net for the identified load pin. At this point, the system of the first embodiment proceeds to step 1010.

At step 1010, the layout constraint generation module 318 checks to see if there are any more pins of the desired type (load or driver) on the selected cell instance. If there are more pins of the appropriate type, the next pin is selected at step 1012. This is accomplished by accessing the next entry in array 708 of cell instance pin data structures for the given cell instance data structure 700. As with step 1004, if the cover_design option is selected, the first driver to load pin pair for the identified load pin is selected. For each such pin or pin pair, steps 1006, 1008, 1009, 1010 and 1011 are repeated until no more pins of the desired type (load or driver) are left. Then, at step 1014, the layout constraint generation module 318 determines whether there are any more cell instance data structures 700 in the netlist data structure 312. For each cell instance data structure 700 in the netlist, steps 1004–1012 are repeated. In this manner, the netlist data structure is traversed and all of the cell instance pin data structures are examined to see if the corresponding pins or pin pairs should be used to generate layout constraints. The set of cell instance pin data structures (or set of pairs of driver and load cell instance pin data structures) that results is then used to generate an appropriate set of layout constraints.

The next step performed by the system 300, shown as step 408 in FIG. 4, is to identify the most critical paths through each of the pins or pin pairs identified in step 406 of FIG. 4. The most critical path in the first embodiment is the path that has the least slack. This is the path that exceeds its timing constraint by the largest margin, or if no path exceeds its timing constraint, it is the path coming closest to exceeding its timing constraint. Other criteria may be used in alternative embodiments of the present invention to identify the most critical path. For instance, slack divided by the number of net segments (slack/net segments) may be used to indicate layout flexibility in some layout tools and could be used to identify the most critical path. The criteria used is preferably matched to the target layout tool. The method used to identify the most critical path through each pin or pin pair in the first embodiment is illustrated in further detail in the flow charts of FIGS. 12, 13, 14A and 14B.

Figure 12:
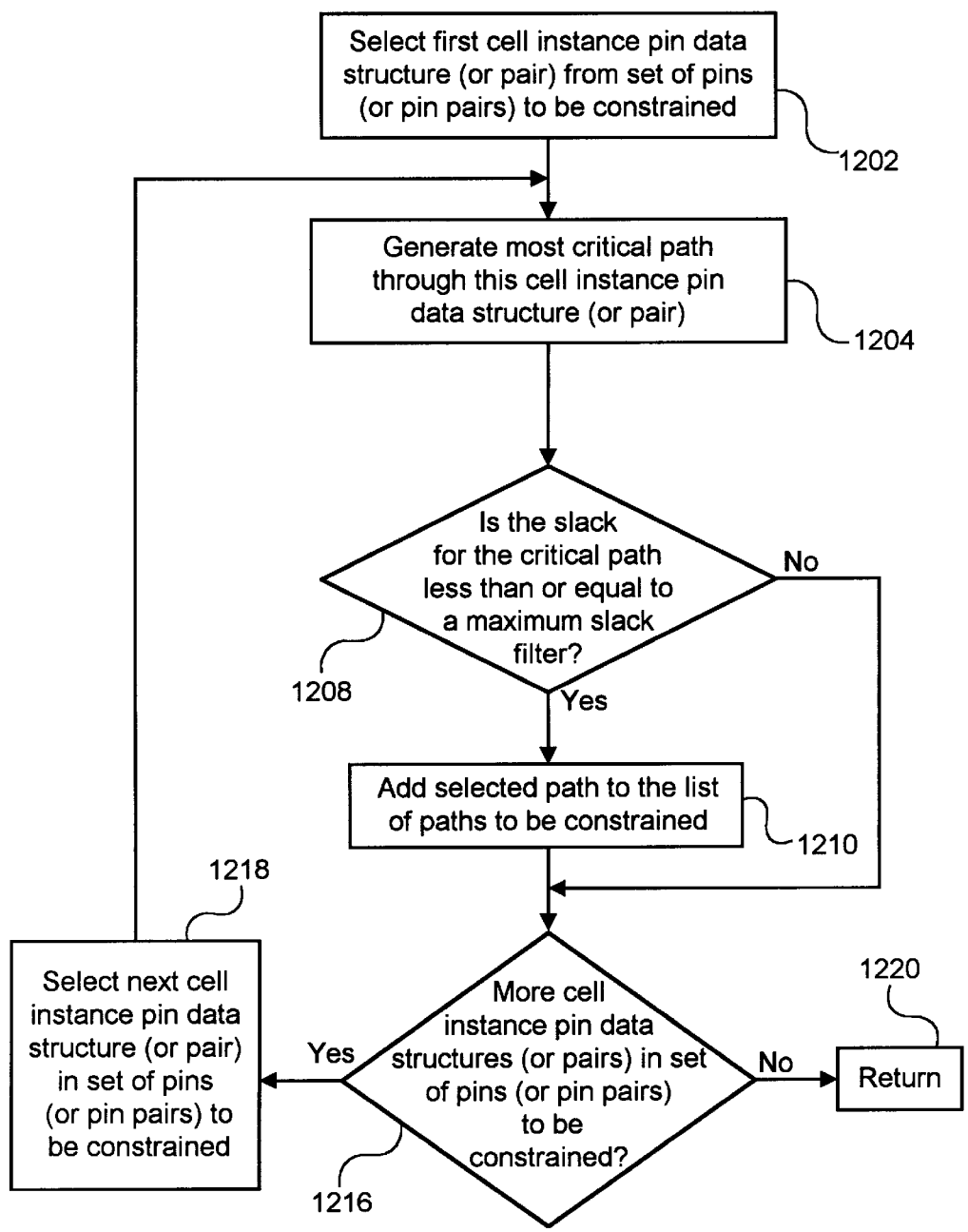
FIG. 12 is a flow chart illustrating a method for determining the most critical paths through specified circuit elements according to the first embodiment of the present invention.

FIG. 12 is a flow chart illustrating a method used in the first embodiment for looping through the set of pins (or pin pairs) identified at step 406 of FIG. 4 and for generating a set of paths to be constrained. As shown at step 1202, the first cell instance pin data structure (or pair) from the set of pins (or pin pairs) identified at step 406 is selected. Then at step 1204, the most critical path through this pin (or pin pair) is generated. The path is returned in a path descriptor data structure which will be described further below with reference to FIGS. 15A and 15B. The path descriptor data structure identifies the startpoint and endpoint of the path and contains a linked list of pointers to cell instance pin data structures and net data structures corresponding to the pins and nets (referred to as path elements) contained within the path. The linked list references the path elements in the order that they would be traversed by a signal passing through the represented circuit path.

At step 1208, the path generated at step 1204 may optionally be tested against a filter requirement. For instance, in the first embodiment, a maximum path slack may be specified as part of the mode control input 310. If the selected path has a slack greater than the specified maximum path slack, the path is discarded. In this way, the number of paths used to generate layout constraints may be filtered based upon the severity of a path's most critical timing constraint. This can be used to limit the number of paths used for large circuit designs. Of course, other filter requirements could be used at this stage. Any of a path's attributes that are accessible through the corresponding path descriptor data structure (which is described in detail below with reference to FIGS. 15A and 15B) may be tested against a specified condition for filtering. Typically, however, paths are not filtered if they will provide unique and useful information to a layout tool. In the normal mode of operation, therefore, filtering at step 1208 is disabled. Filtering may be desired, however, for layout tools having limited capabilities.

If the path is not discarded due to a filter condition at step 1208, it is added to a list of paths from which layout constraints (referred to as a set of paths to be constrained) may be generated as shown at step 1210 in FIG. 12. The set of paths to be constrained may be a linked list of pointers to path descriptor data structures in the first embodiment. The set of paths to be constrained is maintained as the layout constraint generation module 318 loops through the selected pins or pin pairs, so at the end of step 408 in FIG. 4 a complete set of all the paths to be constrained in the circuit design (for the given cover_nets or cover_design option) has been generated.

The layout constraint generation module 318 then checks to see if there are more cell instance pin data structures (or pairs) in the set of pins (or pin pairs) to be constrained as shown at step 1216. If there are more cell instance pin data structures (or pairs) in the set of pins (or pin pairs) to be constrained, the next cell instance pin data structure (or pair) is selected at step 1218 and steps 1204–1210 are repeated as described above using the newly selected cell instance pin data structure (or pair). At step 1216, once the layout constraint generation module 318 determines that all of the cell instance pin data structures (or pairs) in the set of pins (or pin pairs) to be constrained have been examined, the list of all paths to be constrained is returned as shown at step 1220. Although some exceptions and qualifications have been discussed, this list of paths will normally contain a reference to the most critical path through each driver pin in the circuit design for the cover_nets option, or a reference to the most critical path through each driver to load pin pair (that is through each net segment) in the circuit design for the cover_design option.

The method of generating the most critical path through a selected pin (or pin pair) in the first embodiment, shown at step 1204 in FIG. 12, will now be described in further detail with reference to the flow charts of FIGS. 13, 14A and 14B. Aspects of this method will also be described with reference to selected paths in the exemplary circuit design of FIG. 9.

In particular, reference will be made to paths in the sample circuit design of FIG. 9 which include input pin B of NAND gate 918. Two paths include this pin: (1) the path with a startpoint at input port 904, and an endpoint at input pin D to flip-flop 916; and (2) the path with a startpoint at input port 904, and an endpoint at the unnamed input pin to output port 910. It is understood that timing information for these paths would be generated by the static timing analysis module 316 for both rising and falling signal transitions at input pin B to NAND gate 918. For purposes of illustration, it will be assumed that the most critical path through input pin B of NAND gate 918 is for a falling signal transition at this point in the circuit. The following timing constraints are also assumed: a signal is required at input pin D to flip-flop 916 after 19.2 ns, and at the unnamed input pin to output port 910 after 25 ns. The pins included in the two paths are shown in Table 1. For each pin, the arrival and required times that would be calculated by the static timing analysis module 316 are also shown for the appropriate type of signal (rising or falling) assuming a falling signal transition at pin B of NAND gate 918. As described previously, the static timing analysis module of the first embodiment would actually calculate and store arrival and required times for both rising and falling signal transitions, but only the most critical paths through pin B of NAND gate 918 will be discussed for purposes of the present example. For purposes of clarity, this example also only considers maximum timing constraints.

TABLE 1

| Startpoint Name | "Thru" Path Elements (Cell Name/Pin) | Endpoint Name | Arrival Time (ns) | Required Time (ns) | Signal Type |
|---|---|---|---|---|---|
| I100 | | | 0 | 16.73 | Falling |
| | C106/B | | 0 | 16.73 | Falling |
| | C106/Z | | .69 | 17.42 | Rising |
| | C110/A | | .69 | 17.42 | Rising |
| | C110/Z | | .94 | 17.67 | Falling |
| | C112/A | | .94 | 17.67 | Falling |
| | C112/Z | | 1.55 | 18.28 | Rising |
| | | O122 | 1.55 | 25.0 | Rising |
| | C114/A | | 1.55 | 18.28 | Rising |
| | C114/Z | | 1.78 | 18.51 | Falling |
| | C116/A | | 1.78 | 18.51 | Falling |
| | C116/Z | | 2.47 | 19.2 | Rising |
| | C120/D | | 2.47 | 19.2 | Rising |

It will be noted that the required times for all of the pins, except the pin of output port "O122" 910, are based on the 19.2 ns timing constraint for pin D of flip-flop 916. Although a second timing constraint is placed on many of these pins by the timing constraint for output port "O122" 910, as discussed previously, only the smallest required time (for each slot) at a pin is stored which, in this case, derives from the timing constraint on input pin D to flip-flop "C120" 916. It should be noted that the data shown in Table 1 would be calculated by the static timing analysis module 316 of the first embodiment, and would be accessible through timing information field 764 of the timing cell pin data structures 760 in the netlist data structures for the corresponding pins in the circuit design.

Figure 13:
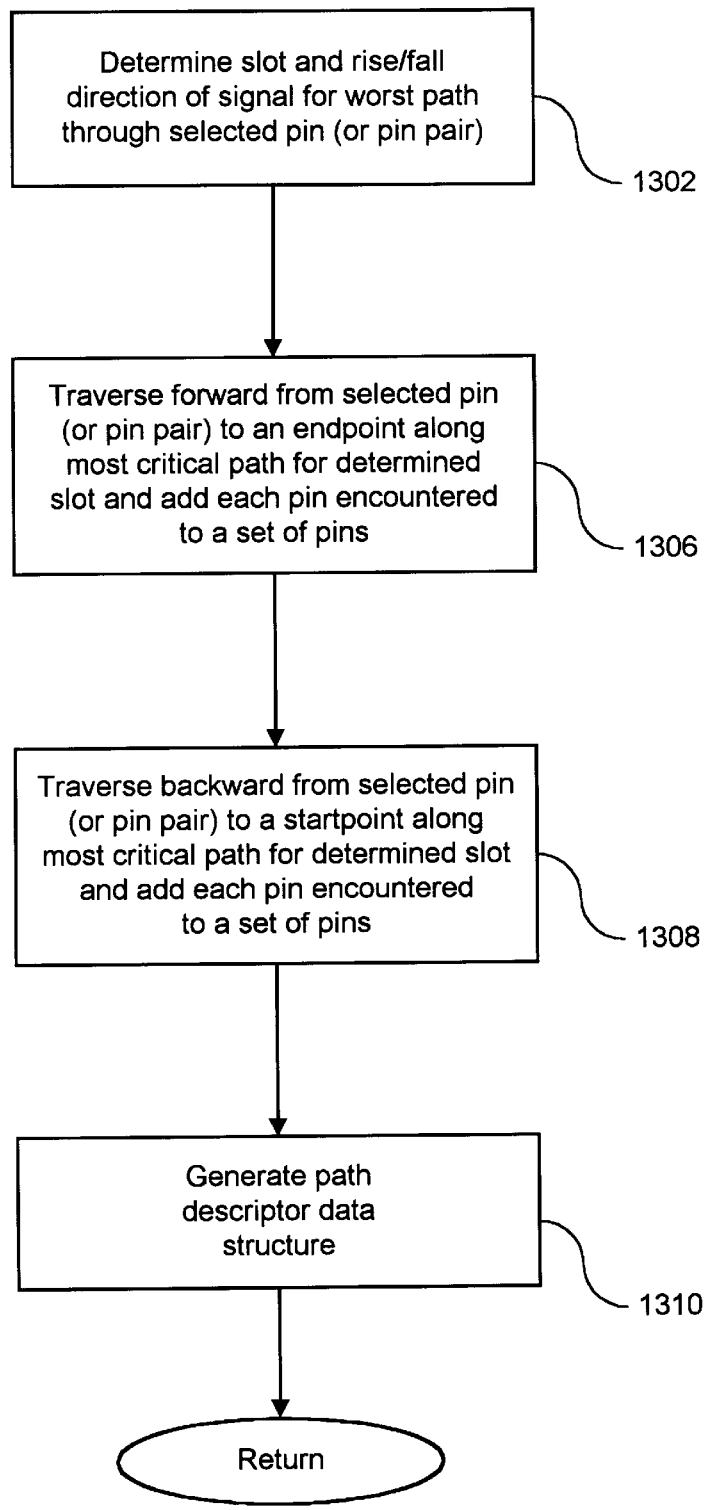
FIG. 13 is a flow chart illustrating a method for generating the most critical path through a specified circuit element according to the first embodiment of the present invention.

FIG. 13 is a flow chart illustrating the method for determining the most critical path through a pin (or pin pair) in the first embodiment. This corresponds to step 1204 in FIG. 12. This method is executed by a netlist access routine 314 upon request from the layout constraint generation module 318. The layout constraint generation module 318 makes a procedure call to a specified netlist access routine 314 and provides a pointer to the selected cell instance pin data structure (or pair) as an input parameter. A path descriptor data structure (discussed further below) for the most critical path through the pin (or pin pair) is returned by the specified netlist access routine.

As shown at step 1302, the netlist access routine for determining the most critical path through a pin (or pin pair) examines the timing information for the selected cell instance pin data structure 720 (or pair of cell instance pin data structures). The timing information for a pin may be accessed through timing cell pin field 730 of the corresponding cell instance data structure which contains a pointer to a corresponding timing cell pin data structure 760. Timing information field 764 of the timing cell pin data structure

760 contains an array of arrival and required times for both rising and falling signal transitions through the pin. The array contains an entry for each slot required for the circuit design. This data is calculated and stored by the static timing analysis module 316 as described previously. At step 1302, the netlist access routine loops through each entry in the array of timing information field 764 (which corresponds to looping through all of the slots). Slack is then calculated for rising and falling signals in each slot. For the cover_nets option, the slot number (which is the index into the array of timing information field 764) and the signal type (either rising or falling) having the lowest slack is determined, and the slot number and signal type are stored in variables in memory. For the cover_design option, only slots and signal types common to both the load pin and the driver pin in the pin pair are examined. The slot number and signal type with the least slack for both pins in the cover_design option are stored in variables in memory. The identified slot number and signal type are then used to traverse through the netlist data structure along the most critical path for the selected pin or pin pair.

As an example, assuming the cover_design option, for input pin B to NAND gate 918 in FIG. 9, only one slot would be required. Thus, there would only be one entry in the array of timing information field 764 for the timing cell pin data structure corresponding to this pin. This entry would contain arrival and required times for both falling and rising signal transitions. For simplicity, it will be assumed that only values for maximum timing constraints are stored, although as discussed previously, minimum timing constraints could be used as well. Slack for both a falling and rising signal transition would be calculated by subtracting the respective arrival time from the respective required time. Using the values shown in Table 1, the slack for the falling signal would be 16.73 ns (16.73 required −0 arrival). This would be compared to the slack for a rising signal. For illustrative purposes, it is assumed that the slack for a rising signal is greater than 16.73 ns. Therefore, the netlist access routine would determine that a falling signal in slot one (the only slot) would have the least slack for input pin B to NAND gate 918. For the cover_design option, input pin B to NAND gate 918 would be paired with the output pin for input port 904. Since this is the only driver for input pin B of NAND gate 918, the slot number and signal type having the least slack will be the same as determined for input pin B of NAND gate 918. Therefore, at step 1302, the netlist access routine would store the slot number (one) and the signal type (falling) for the pin pair to be used in subsequent processing.

As shown at step 1306, the most critical path through the selected pin or pin pair is then constructed by traversing forward through the netlist data structure along the most critical path until a valid endpoint is encountered, such as the input pin to an output port or the input pin to a storage device. To traverse forward from a pin pair for the cover-design option, the system traverses forward from the load pin of the pin pair. When traversing forward through the netlist data structure, the slot number and signal type stored at step 1302 are used. The system of the first embodiment examines all of the potential pins that may be the next pin along the most critical path. The pin with the least slack for the given slot and signal type is added to the path. If multiple pins have the same slack, and they are identified as having the least slack, any one of the pins may be selected in the first embodiment. Then the system traverses forward from that pin, and the process is continued until an endpoint is encountered. The slot number stays the same during this process, but the signal type may change when the path passes through a cell instance. To traverse forward through a cell instance, the timing arcs through the cell instance are examined to find all of the possible input (or bidirectional) pin to output (or bidirectional) pin path segments (referred to as arcs) through the cell instance. When an arc is traversed it may change the type of signal from rising to falling or conversely. For instance, a NAND gate or invertor gate cell instance will change the type of signal to the opposite of that received at its inputs. As discussed previously, information regarding possible arcs through a cell instance and the corresponding effect upon the signal type may be found in timing information field 666 of the timing arc data structures 660 for the respective cell instance. As the system of the first embodiment traverses along the path, the pins encountered may be added to a linked list of pins for the path. For the cover_nets option, the linked list of pins in the path starts with the selected driver pin from step 1302. For the cover_design option, the linked list of pins starts with both the driver pin and the load pin for the selected pin pairs. Additional pins are added to the end of the linked list as they are encountered while traversing forward through the netlist data structure along the most critical path.

After the endpoint for the critical path is found, the system of the first embodiment may trace backwards through the netlist data structure from the selected pin or pin pair until a valid startpoint for the path is found as shown at step 1308. To traverse backwards from a driver to load pin pair, the system of the first embodiment traverses the netlist data structure backward from the cell instance data structure for the driver pin in the pin pair. Each of the potential previous pins for the path is examined for the slot number and signal type as determined at step 1302, and the previous pin with the least slack for the given slot and appropriate signal type is followed. If multiple pins have the same slack, and they are identified as having the least slack, any one of the pins may be selected in the first embodiment. As discussed above, traversing through a cell instance may change the signal type for the previous pin. As the system of the first embodiment traverses along the path, the pins encountered may be added to the linked list of pins for the path. While traversing backward through the netlist data structure, additional pins are added to the beginning of the linked list as they are encountered. When steps 1306 and 1308 are completed, a linked list of pointers to cell instance pin data structures representing all of the pins from the startpoint to the endpoint of the path has been constructed. The pins in the linked list are arranged in the order that they would be encountered along the path from startpoint to endpoint.

Figure 14A:
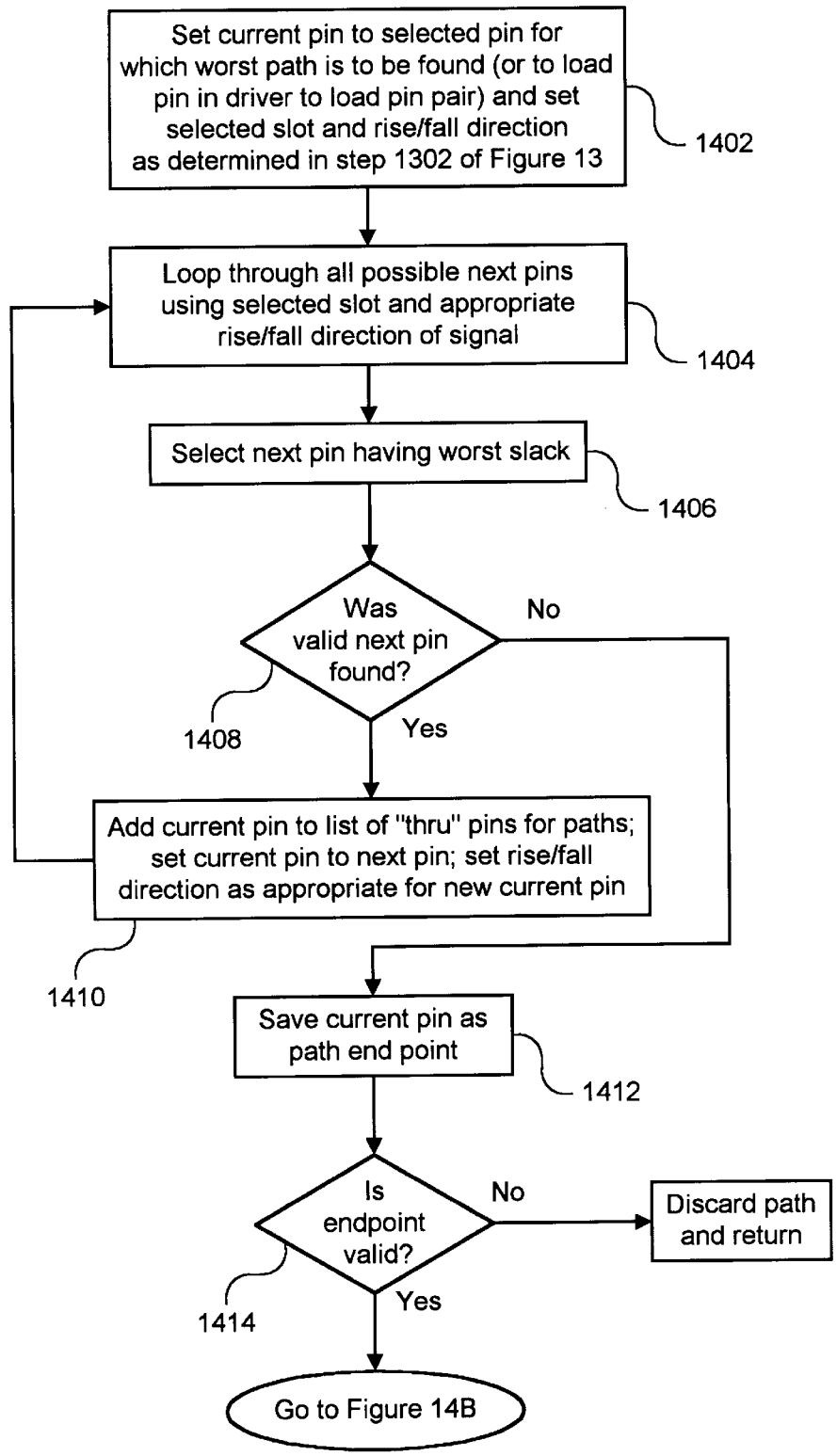
FIG. 14A is a flow chart illustrating a method for traversing forward through a netlist data structure from a specified circuit element to a path endpoint along the most critical path according to the first embodiment of the present invention.
Figure 14B:
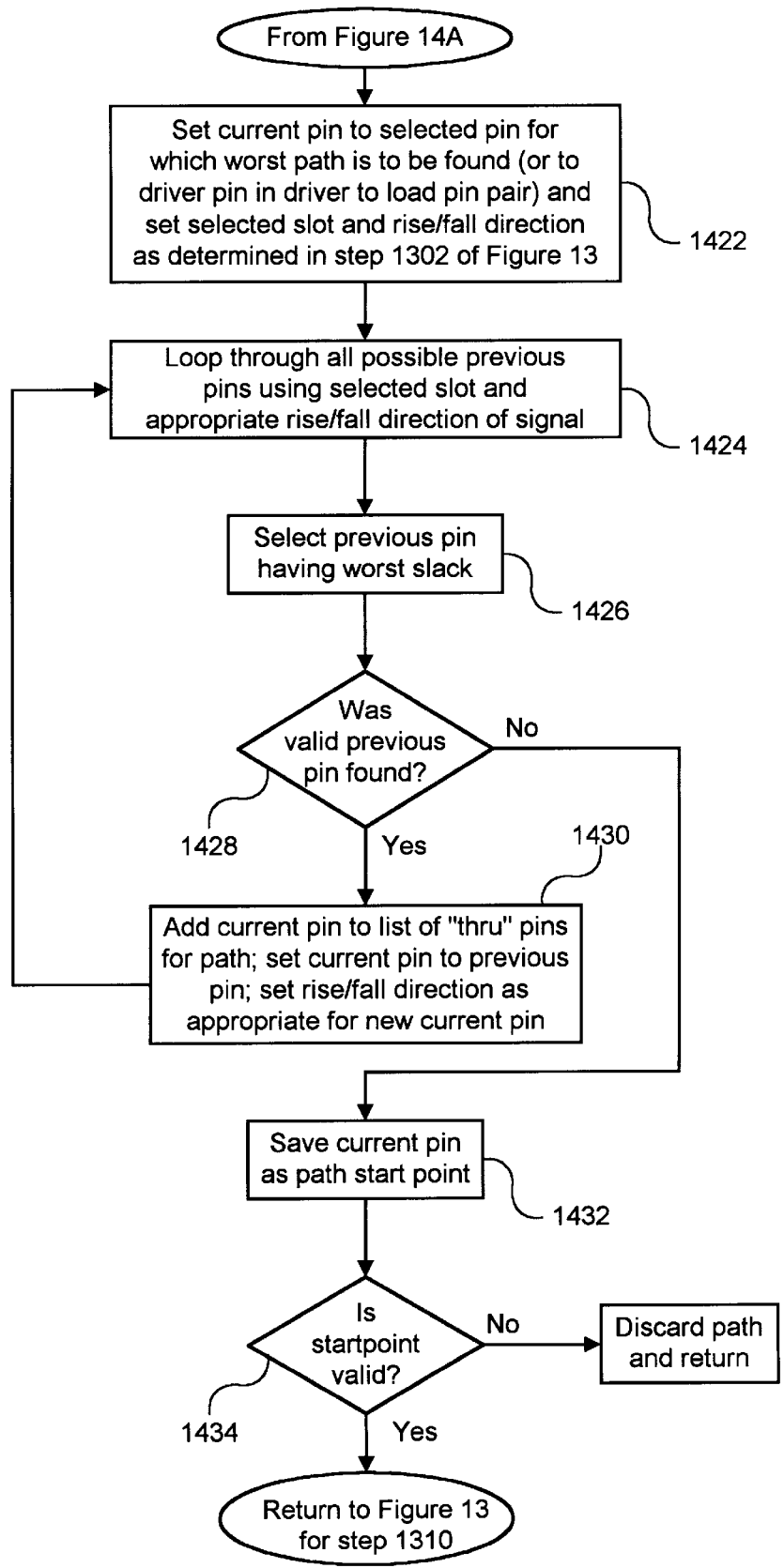
FIG. 14B is a flow chart illustrating a method for traversing backward through a netlist data structure from a specified circuit element to a path startpoint along the most critical path according to the first embodiment of the present invention.

Steps 1306 and 1308 are shown in further detail in the flow charts of FIG. 14A and 14B respectively. As shown at step 1402, the netlist access routine that constructs the most critical path through the selected pin (or pin pair) first sets a current pin pointer to point to the cell instance pin data structure for the selected driver pin (for the cover_nets option) or to the cell instance pin data structure for the load pin of the driver to load pin pair if the cover_design option is used. Variables for the current slot number and current signal type are also set to correspond to the values determined at step 1302 of FIG. 13. For instance, if the selected pin was input pin B of NAND gate 918 in FIG. 9, the current pin pointer would be set to point to the cell instance pin data structure for that pin in the netlist data structure. The current slot number would be set to one (1) and the current signal type would be set to falling, since these were the values determined at step 1302.

At step 1404, the system of the first embodiment then loops through all of the possible pins that may be the next pin along the most critical path using the current slot and appropriate signal type. For output pins or bidirectional pins driving a net, all of the input pins (or bidirectional pins loading the net) must be examined as a possible next pin along the path. For these pins, the signal type stays the same (since a net does not change a rising or falling signal). For input pins or bidirectional pins loading the net, the cell instance to which the pin is attached must be examined. The arcs to all of the possible output pins through the cell instance from the given input or bidirectional must be examined, and the potential effect on the signal type must be considered.

For output pins (or bidirectional pins acting as drivers), the appropriate next pins may be identified by examining net field 724 of the cell instance pin data structure 720 for the current pin. The net field 724 contains a pointer to the net data structure which in turn contains a list of input, output and bidirectional pins on the net pin fields 746, 748, and 750 respectively. By traversing through the lists in fields 746 and 750, cell instance pin data structures for all of the input and bidirectional pins on the net may be examined. As each cell instance data structure is accessed for input and bidirectional pins, the slack for the current slot and signal type may be calculated. This is accomplished by examining timing information field 764 of the timing cell pin data structure 760 linked to the respective cell instance pin data structure. The current slot is used as an index into the array of timing information field 764 and the arrival and required times for that slot are retrieved. The entry in the array contains arrival and required times for both rising and falling edge signal transitions. Only the arrival and required times for the current signal type are used. Slack is calculated by subtracting the arrival time for the current slot and signal type from the required time. As shown at step 1406 in FIG. 14A, after all of the potential next pins are identified, the pin having the least slack is selected. If multiple pins have the same slack, and they are identified as having the least slack, any one of the pins may be selected in the first embodiment.

For instance, if output pin Z for invertor gate 926 in FIG. 9 was the current pin, the system of the first embodiment would identify the input pin to output port 910 and the input pin A to invertor gate 928 as potential next pins. These potential next pins would be identified by traversing the cell instance pin data structures for net 948 through net field 724 of the cell instance pin data structure for output pin Z of invertor gate 926. Assuming a current slot of one (1) and a current signal type of rising, the arrival and required times for a rising signal in slot one for the identified potential next pins would be used to calculate slack. Using the data shown in Table 1, the slack for the input pin to output port 910 would be 23.45 ns, and the slack for the input pin A of invertor gate 928 would be 16.73 ns. Since the input pin A of invertor gate 928 has the lower slack it would be selected as the next pin along the most critical path at step 1406.

A similar process is followed for input pins (or bidirectional pins acting as loads). The appropriate next pins may be identified by examining the timing arcs for the current pin. The timing arcs may be accessed through library cell pin field 728 of the cell instance pin data structure 720 for the current pin. The corresponding library cell pin data structure 620 is linked to a list of timing arcs emanating from the current pin contained in ending timing arcs field 642 of the corresponding timing library cell pin data structure 640. The output pins (or bidirectional pin acting as a driver) at which these arcs terminate (as determined by "to pin" field 664 of the timing arc data structure 660) are the potential next pins. For each potential next pin, the effect of the cell instance on the signal (that is whether the type of signal is changed from rising to falling, falling to rising, or remains the same) for the corresponding arc must also be determined. This information is accessed through timing data field 666 of the timing arc data structure. The slack for each potential next pin is calculated using the current slot and the appropriate signal type (which is the current signal type or the inverse of the current signal type if the timing arc changes the signal type). As shown at step 1406 in FIG. 14A, after all of the potential next pins are identified, the pin having the least slack is selected. If multiple pins have the same slack, and they are identified as having the least slack, any one of the pins may be selected in the first embodiment.

For instance, if input pin B for NAND gate 918 in FIG. 9 was the current pin, the system of the first embodiment would examine the timing arcs emanating from the current pin 918. Only the timing arc ending at output pin Z of NAND gate 918 emanates from the current pin. This timing arc would invert the signal type, since it is a timing arc through a NAND gate. Assuming a current slot of one (1) and a current signal type of falling, the arrival and required times for a rising signal in slot one for the output pin Z on NAND gate 918 would be used to calculate slack. Using the data shown in Table 1, the slack for the output pin Z on NAND gate 918 would be 16.73 ns. Since this pin is the only potential next pin, it must have the lowest slack, and it would be selected as the next pin along the most critical path at step 1406.

The next pin that was selected at step 1406 is checked at step 1408 in FIG. 14A to determine whether a valid next pin was found. If a valid next pin has been found, a pointer to the cell instance pin data structure for the current pin will be added to the end of a linked list of "thru" pins as shown at step 1410. This linked list is used to accumulate all of the pins that are included in the most critical path. After the cell instance pin data structure for the current pin has been added to the linked list of "thru" pins, the current pin variable is set equal to the next pin. The current signal type is also altered as appropriate for the next pin. Then steps 1404–1410 are repeated for the new current pin and signal type. In this way, the system of the first embodiment traverses forward through the netlist data structure along the most critical path through a selected pin. This process is continued until no valid next pin is found as determined by step 1408. This will occur, for instance, at the endpoint of the path. When there is no valid next pin, the current pin is saved as the endpoint for the path as shown at step 1412.

At step 1414, the system of the first embodiment checks the endpoint that was saved at step 1412 to see if it is a valid endpoint. For the first embodiment, valid endpoints include input pins to output or bidirectional ports and input pins to storage elements. In some instances, invalid endpoints may be detected. For instance, if a path terminated at the output of an invertor with no further connection to an output port, the endpoint would be invalid. If an invalid endpoint is detected, the path is discarded, and the system of the first embodiment moves on to the next pin or pin pair. If a valid endpoint is found, the system of the first embodiment will traverse backward through the netlist data structure to find the startpoint for the path as shown in FIG. 14B.

As shown at step 1422 in FIG. 14B, the system resets the current pin pointer to point to the cell instance pin data structure for the selected pin or for the driver pin of the driver to load pin pair if the cover_design option is used. Variables for the current slot number and current signal type are also reset to correspond to the values determined at step 1302 of FIG. 13.

At step 1424, the system of the first embodiment then loops through all of the possible pins that may be the previous pin along the most critical path using the current slot and appropriate signal type. For input pins or bidirectional pins loading a net, all of the output pins (or bidirectional pins) driving the net must be examined as a possible previous pin along the path. For these pins, the signal type stays the same (since a net does not change a rising or falling signal). For output pins or bidirectional pins driving the net, the timing arcs ending at the current pin must be examined. The arcs from all of the possible input and bidirectional pins must be examined, and the potential effect on the signal type must be considered.

For input pins (or bidirectional pins acting as a load), the appropriate previous pins may be identified by examining net field 724 of the cell instance pin data structure 720 for the current pin and the output pins field 748 and bidirectional pins field 750 of the corresponding net data structure 740. As output pins (or bidirectional pins acting as a driver) are encountered, the slack for the current slot and signal type may be calculated. This is accomplished by examining timing information field 764 of the timing cell pin data structure 760 linked to the respective cell instance pin data structure. The current slot is used as an index into the array of timing information field 764 and the arrival and required times for that slot are retrieved. The entry in the array contains arrival and required times for both rising and falling edge signals. Only the arrival and required times for the current signal type are used. Slack is calculated by subtracting the arrival time for the current slot and signal type from the required time. As shown at step 1426 in FIG. 14B, after all of the potential previous pins are identified, the pin having the least slack is selected. If multiple pins have the same slack, and they are identified as having the least slack, any one of the pins may be selected in the first embodiment.

For instance, if input pin A for invertor gate 926 in FIG. 9 was the current pin, the system of the first embodiment would identify the output pin of NAND gate 922 as the only potential previous pin. This pin would be identified by traversing the cell instance pin data structures to net 946 through net field 724 of the cell instance pin data structure for input pin A of invertor gate 926. Assuming a current slot of one (1) and a current signal type of falling, the arrival and required times for a falling signal in slot one for the identified potential previous pin would be used to calculate slack. Using the data shown in Table 1, the slack for the output pin of NAND gate 922 would be 16.73 ns. Since there is only one potential previous pin, it will have the lowest slack and would be selected as the previous pin along the most critical path at step 1406.

A similar process is followed for output pins (or bidirectional pins acting as drivers). The appropriate previous pins may be identified by examining the timing arcs ending at the current pin. The timing arcs may be accessed through the library cell pin data structure corresponding to the cell instance pin data structure 720 for the current pin. Each input (or bidirectional pin acting as a load) on a timing arc ending at the current pin is a potential previous pin. For each potential previous pin, the effect of the cell instance on the signal (that is whether the type of signal is changed from rising to falling or conversely) for the given arc must also be determined. This information is accessed through timing data field 666. The slack for each potential previous pin is calculated using the current slot and the appropriate signal type (which is the current signal type or the inverse of the current signal type if the timing arc changes the signal type). As shown at step 1426 in FIG. 14A, after all of the potential previous pins are identified, the pin having the least slack is selected. If multiple pins have the same slack, and they are identified as having the least slack, any one of the pins may be selected in the first embodiment.

For instance, if output pin Z for NAND gate 918 in FIG. 9 was the current pin, the system of the first embodiment would examine the timing arcs ending at the current pin. The timing arcs emanating from both input pins A and B of NAND gate 918 would end at the current pin. These timing arcs would invert the signal type, since they are timing arcs through a NAND gate. Assuming a current slot of one (1) and a current signal type of falling, the arrival and required times for a falling signal in slot one for the input pins A and B on NAND gate 918 would be used to calculate slack. Using the data shown in Table 1, the slack for the input pin B on NAND gate 918 would be 16.73 ns. If the slack for the input pin A on NAND gate 918 is greater than 16.73 ns, input pin B on NAND gate 918 would be selected as the previous pin along the most critical path at step 1426.

The previous pin that was selected at step 1426 is checked at step 1428 in FIG. 14A to determine whether a valid previous pin was found. If a valid previous pin has been found, a pointer to the cell instance pin data structure for the current pin will be added to the beginning of the linked list of "thru" pins as shown at step 1430. This linked list is used to accumulate all of the pins that are included in the most critical path. After the cell instance pin data structure for the current pin has been added to the linked list of "thru" pins, the current pin variable is set equal to the previous pin. The current signal type is also altered as appropriate for the previous pin. Then steps 1424–1430 are repeated for the new current pin and signal type. In this way, the system of the first embodiment traverses backward through the netlist data structure along the most critical path through a selected pin. This process is continued until no valid previous pin is found as determined by step 1428. This will occur, for instance, at the startpoint of the path. When there is no valid previous pin, the current pin is saved as the startpoint for the path as shown at step 1432.

At step 1434, the system of the first embodiment checks the startpoint that was saved at step 1432 to see if it is a valid startpoint. For the first embodiment, valid startpoints include output pins to input or bidirectional ports and output pins on storage elements. In some instances, invalid startpoints may be detected. For instance, if a path started at an input pin for an invertor that was unconnected, the startpoint would be invalid. If an invalid startpoint is detected, the path is discarded, and the system of the first embodiment moves on to the next pin or pin pair. If a valid startpoint is found, the system of the first embodiment will then construct a path descriptor data structure for the path as shown at step 1310 of FIG. 13.

The path descriptor data structure used in the system of the first embodiment will now be described with reference to FIGS. 15A and 15B. The path descriptor data structure is used to pass path information from the netlist access routines 314 to the layout constraint generation mode 318. The path descriptor data structure references all of the information needed to generate layout constraints for the given path.

Figure 15A:
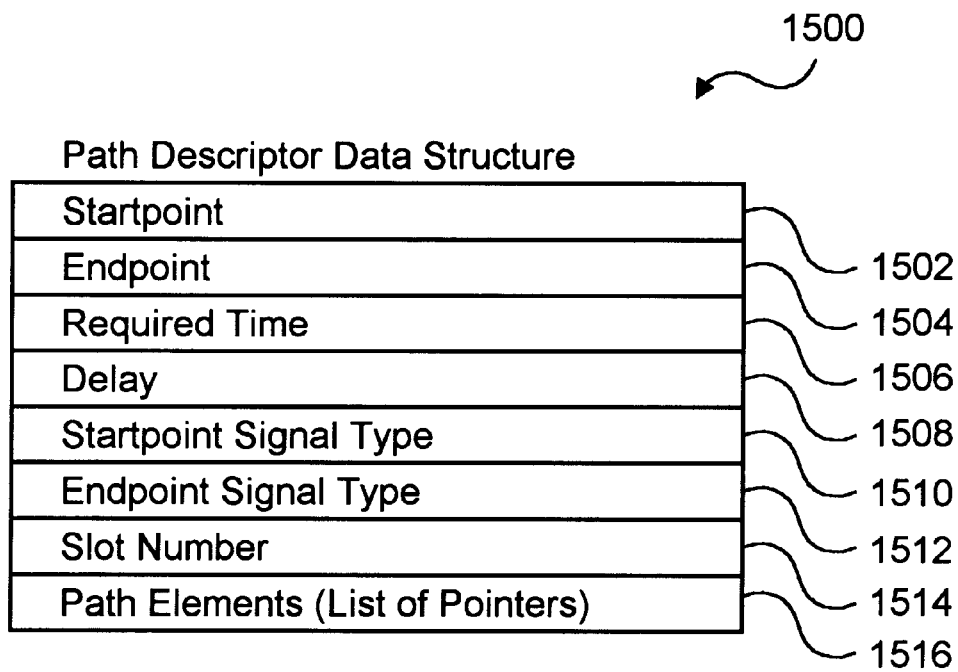
FIG. 15A illustrates a path descriptor data structure for storing and organizing path information in memory according to the first embodiment of the present invention.
Figure 15B:
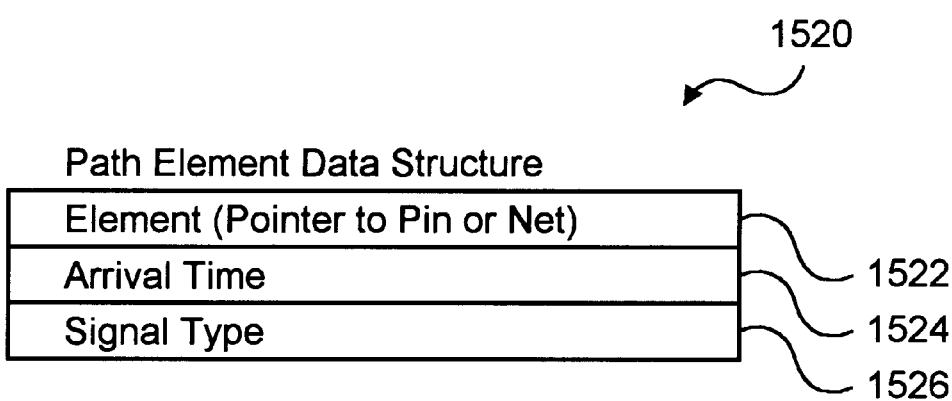
FIG. 15B illustrates a path element data structure for storing and organizing path element information according to the first embodiment of the present invention.

Referring to FIG. 15A, the path descriptor data structure 1500 includes eight fields associated in memory, numbered 1502–1516 in FIG. 15A. The startpoint field 1502 contains information indicating the startpoint of the path. This information preferably includes a pointer to the cell instance pin data structure for the pin at the start of the path and a pointer to the cell instance data structure for the input or bidirectional port or cell instance at the start of the path. Endpoint field 1504 contains information indicating the endpoint of the path. This information preferably includes a pointer to the cell instance pin data structure for the pin at the end of the path and a pointer to the cell instance data structure for the output or bidirectional port or cell instance at the end of the path. The information necessary for the startpoint field 1502 and endpoint field 1504 is readily available through the cell instance pin data structures for the starting and ending pins in the path which are saved by the system of the first embodiment at steps 1432 and 1412 shown in FIGS. 14A and 14B.

The next five fields in the path descriptor data structure 1500 store timing related information for the overall path. The required time field 1506 contains the required time during which a signal must propagate through the path in order to meet timing constraints. The required time for the path is determined by subtracting the arrival time for the startpoint pin from the required time for the endpoint pin in the given slot. The delay field 1508 contains the calculated delay for a signal propagating through the path. The delay is determined by subtracting the arrival time for the startpoint pin from the arrival time for the endpoint pin in the given slot. The startpoint signal type field 1510 and the endpoint signal type field 1512 contain the signal type (rising or falling) at the startpoint and endpoint pins for the path, respectively. The slot number field 1514 contains the slot number for the path. This is the same slot number that is determined in step 1302 of FIG. 13.

The path elements field 1516 of the path descriptor data structure contains a set of path elements included in the path. The path elements referenced in the set include the pins and nets in the path. In the first embodiment the set of path elements is a linked list of pointers to path element data structures 1520, illustrated in FIG. 15B and described further below. A separate path element data structure 1520 is created for each pin and net in the path. All of the information required for the path element data structures may be accessed through the linked list of pins in the path which is generated at steps 1306 and 1308 of FIG. 13.

The path element data structure 1520 includes three fields associated in memory. The element field 1522 contains a reference to the pin or net for which the path element data structure 1520 has been created. In the first embodiment, the element is a pointer to the cell instance pin data structure or net data structure for the respective pin or net. The arrival time field 1524 contains the time for a signal to reach the pin or net in the path. This arrival time is determined by subtracting the arrival time for the path startpoint from the arrival time for the path element in the given slot. The signal type field 1526 contains the signal type (either rising or falling) for a signal reaching the respective pin or net on the path. This signal type is determined as described previously.

The system of the first embodiment retains a list of all the path descriptor data structures for paths to be constrained for the netlist being processed. The path descriptor data structures are then used to filter paths, to prioritize paths and discard duplicates, and to generate layout constraints as previously described with reference to steps 410, 412 and 414 of FIG. 4.

For step 410, the slack for the path (or alternatively any other path attribute that can be determined from the path descriptor data structure) may be tested against an optional filter criteria specified as part of the mode control input. The slack for the path may be determined by subtracting the delay for the path from the required time for the path. These values are available from the delay field 1508 and required time field 1506 of the path descriptor data structure respectively.

For step 412, the linked list of paths to be constrained may be sorted in order of increasing slack. Any duplicate paths may then be removed from the list. Paths may be duplicated in the list where the same path is the most critical path for more than one driver pin (using the cover_nets option) or more than one driver to load pin pair (using the cover_design option). Duplicate paths may be detected by comparing the startpoint, endpoint, and path elements stored in the path descriptor data structures for two paths.

Since the list of path descriptor data structures is sorted in order of increasing slack in step 412, the set of paths may easily be limited to an integer number of paths having the least slack. This may be desirable for layout tools that are only able to consider a limited number of constraints. This optional limitation on the number of paths to be used may be specified as part of the mode control input. While this is similar to the conventional N worst paths method, in this case the N paths are selected from only a subset of all possible paths through a circuit. As described previously, the subset of paths is generated by considering only the most critical path through specified circuit elements (such as driver pins, or net segments defined by driver to load pin pairs).

At step 414, the remaining set of path descriptor data structures may be used to generate layout constraints in the format most appropriate to the target layout tool. It will be apparent to those of ordinary skill in the art that all of the information required to generate layout constraints in any variety of formats, including SDF, is readily available through the path descriptor data structures for the remaining paths. What is desirable for the system of the first embodiment is that the set of information used to generate the layout constraints is limited to the most critical paths through specified circuit elements, and is not generated based upon all of the possible paths through a circuit.

Exemplary SDF files for the circuit design illustrated in FIG. 9 are shown in Tables 2, 3, and 4 below. Table 2 shows the contents of an SDF file that contains path constraints for all thirteen of the signal paths through the circuit design. The SDF file of Table 2 may be generated using conventional techniques. Table 3 shows the contents of an SDF file that may be generated using a cover_design option according to an embodiment of the present invention. The SDF file of Table 3 contains path constraints for nine signal paths through the circuit design. These nine paths represent the nine most critical paths covering all the net segments in the circuit design. Even with the relatively simple circuit design of FIG. 9, four less path constraints are generated than in the conventional approach shown in Table 1 without a loss of useful information for typical layout tools. With large complex circuit designs (having tens of thousands of cell instances), the number of path constraints generated may be reduced by a factor of one hundred (100) or more. Table 4 shows the contents of an SDF file that may be generated using a cover_nets option according to an embodiment of the present invention. The SDF file of Table 4 contains path constraints for seven signal paths through the circuit design. These seven signal paths cover each net in the circuit design with the most critical constraint. However, some net segments are not fully constrained. Nevertheless, this SDF file may be appropriate for some target layout tools.

TABLE 2

```
/*
* Contains constraints generated for all paths (13)
*/
(DELAYFILE
(SDFVERSION)
(DESIGN "PATENT")
(DATE "Mon Jan 16 08:43:54 1995")
(VENDOR "class")
(PROGRAM "Synopsys Design Compiler cmos")
(VERSION "v4.0a-slot3-practice")
(DIVIDER /)
(VOLTAGE 5.00:5.00:5.00)
(PROCESS)
(TEMPERATURE 25.00:25.00:25.00)
(TIMESCALE 1ns)
(CELL
     (CELLTYPE "PATENT")
     (INSTANCE)
     (TIMINGCHECK
          (PATHCONSTRAINT I102 C108/B C108/Z C110/B C110/Z C112/A C112/Z
C114/A C114/Z C116/A C116/Z C120/D (14.200:14.200:14.200))
          (PATHCONSTRAINT C104/CP C104/Q C106/A C106/Z C110/A C110/Z C112/A
C112/Z C114/A C114/Z C116/A C116/Z C120/D (19.200:19.200:19.200))
          (PATHCONSTRAINT C120/CP C120/Q C118/A C118/Z C116/B C116/Z C120/D
(19.200:19.200:19.200))
          (PATHCONSTRAINT I100 C108/A C108/Z C110/B C110/Z C112/A C112/Z
C114/A C114/Z C116/A C116/Z C120/D (19.200:19.200:19.200))
          (PATHCONSTRAINT I100 C106/B C106/Z C110/A C110/Z C112/A C112/Z
C114/A C114/Z C116/A C116/Z C120/D (19.200:19.200:19.200))
          (PATHCONSTRAINT I124 C118/E C118/Z C116/B C116/Z C120/D
(19.200:19.200:19.200))
          (PATHCONSTRAINT I102 C108/B C108/Z C110/B C110/Z C112/A C112/Z O122
(20.000:20.000:20.000))
          (PATHCONSTRAINT B126 C116/B C116/Z C120/D (19.200:19.200:19.200))
          (PATHCONSTRAINT C104/CP C104/Q C106/A C106/Z C110/A C110/Z C112/A
C112/Z O122 (25.000:25.000:25.000))
          (PATHCONSTRAINT C120/CP C120/Q C118/A C118/Z B126
(25.000:25.000:25.000))
          (PATHCONSTRAINT I100 C108/A C108/Z C110/B C110/Z C112/A C112/Z O122
(25.000:25.000:25.000))
          (PATHCONSTRAINT I100 C106/B C106/Z C110/A C110/Z C112/A C112/Z O122
(25.000:25.000:25.000))
)))
```

TABLE 3

```
/*
* Contains constraints generated using the 'cover_design' option (9).
*/
(DELAYFILE
(SDFVERSION)
(DESIGN "PATENT")
(DATE "Mon Jan 16 08:43:59 1995")
(VENDOR "class")
(PROGRAM "Synopsys Design Compiler cmos")
(VERSION "v4.0a-slot3-practice")
(DIVIDER /)
(VOLTAGE 5.00:5.00:5.00)
(PROCESS)
(TEMPERATURE 25.00:25.00:25.00)
(TIMESCALE 1ns)
(CELL
     (CELLTYPE "PATENT")
     (INSTANCE)
     (TIMINGCHECK
          (PATHCONSTRAINT I102 C108/B C108/Z C110/B C110/Z C112/A C112/Z
C114/A C114/Z C116/A C116/Z C120/D (14.200:14.200:14.200))
          (PATHCONSTRAINT C104/CP C104/Q C106/A C106/Z C110/A C110/Z C112/A
C112/Z C114/A C114/Z C116/A C116/Z C120/D (19.200:19.200:19.200))
          (PATHCONSTRAINT C120/CP C120/Q C118/A C118/Z C116/B C116/Z C120/D
(19.200:19.200:19.200))
          (PATHCONSTRAINT I100 C108/A C108/Z C110/B C110/Z C112/A C112/Z
C114/A C114/Z C116/A C116/Z C120/D (19.200:19.200:19.200))
          (PATHCONSTRAINT I100 C106/B C106/Z C110/A C110/Z C112/A C112/Z
C114/A C114/Z C116/A C116/Z C120/D (19.200:19.200:19.200))
          (PATHCONSTRAINT I124 C118/E C118/Z C116/B C116/Z C120/D
```

TABLE 3-continued

```
(19.200:19.200:19.200))
      (PATHCONSTRAINT I102 C108/B C108/Z C110/B C110/Z C112/A C112/Z O122
(20.000:20.000:20.000))
      (PATHCONSTRAINT B126 C116/B C116/Z C120/D (19.200:19.200:19.200))
      (PATHCONSTRAINT C120/CP C120/Q C118/A C118/Z B126
(25.000:25.000:25.000))
      )
)
)
```

TABLE 4

```
/*
* Contains constraints generated using the 'cover_net' option (7).
*/
(DELAYFILE
(SDFVERSION)
(DESIGN "PATENT")
(DATE "Mon Jan 16 08:44:04 1995")
(VENDOR "class")
(PROGRAM "Synopsys Design Compiler cmos")
(VERSION "v4.0a-slot3-practice")
(DIVIDER /)
(VOLTAGE 5.00:5.00:5.00)
(PROCESS)
(TEMPERATURE 25.00:25.00:25.00)
(TIMESCALE 1ns)
(CELL
     (CELLTYPE "PATENT")
     (INSTANCE)
     (TIMINGCHECK
       (PATHCONSTRAINT I102 C108/B C108/Z C110/B C110/Z C112/A C112/Z
C114/A C114/Z C116/A C116/Z C120/D (14.200:14.200:14.200))
       (PATHCONSTRAINT C104/CP C104/Q C106/A C106/Z C110/A C110/Z C112/A
C112/Z C114/A C114/Z C116/A C116/Z C120/D (19.200:19.200:19.200))
       (PATHCONSTRAINT C120/CP C120/Q C118/A C118/Z C116/B C116/Z C120/D
(19.200:19.200:19.200))
       (PATHCONSTRAINT I100 C108/A C108/Z C110/B C110/Z C112/A C112/Z
C114/A C114/Z C116/A C116/Z C120/D (19.200:19.200:19.200))
       (PATHCONSTRAINT I124 C118/E C118/Z C116/B C116/Z C120/D
(19.200:19.200:19.200))
       (PATHCONSTRAINT B126 C116/B C116/Z C120/D (19.200:19.200:19.200))
       (PATHCONSTRAINT C120/CP C120/Q C118/A C118/Z B126
(25.000:25.000:25.000))
       )
)
)
```

The foregoing description is presented to enable any person skilled in the art to make and use the invention. Descriptions of specific designs are provided only as examples. Various modifications to the preferred embodiment will be readily apparent to those skilled in the art, and the generic principles defined herein may be applied to other embodiments and applications without departing from the spirit and scope of the invention. Thus, the present invention is not intended to be limited to the embodiments shown, but is to be accorded the widest scope consistent with the principles and features disclosed herein.

For instance, aspects of the present invention may be applicable any time it is desired to identify a set of paths based on the most critical paths through specified circuit elements. The criticality of the paths may be determined by slack or other timing information, such as delay through the path or lowest required time for a path. In addition, the criticality of the path could be based upon minimum as well as maximum timing constraints. The specified circuit elements could be input ports, output ports, bidirectional ports, input pins, output pins, bidirectional pins, cell instances (which may be further distinguished based on the type of cell represented, such as combinational cells versus sequential cells), nets, net segments, and the like. Further, entire paths may not need to be generated for all of the specified circuit elements. Rather, information about the most critical path may simply be provided for each specified circuit element, such as slack at the circuit element and/or for the overall path. By limiting the information used to generate layout constraints based on specified circuit elements, aspects of the present invention allow layout constraints to be generated for the specified circuit elements without having to generate or consider all of the paths through a circuit. Further, aspects of the present invention allow the number of layout constraints to be limited while ensuring that each specified circuit element is constrained.

While this invention has been described and illustrated with reference to particular embodiments, it will be readily apparent to those skilled in the art that the scope of the present invention is not limited to the disclosed embodiments but, on the contrary, is intended to cover numerous other modifications and equivalent arrangements which are included within the spirit and scope of the following claims.

What is claimed is:

1. A digital computer system for processing a netlist to generate circuit layout constraints for use by an identified target circuit placement and signal routing tool, the system including a computer having storage means and execution means, the system comprising:

means for storing a netlist data structure in said storage means, said netlist data structure representing a circuit configuration having a plurality of circuit elements and said netlist data structure representing static timing information for said circuit configuration;

means for selecting specified circuit elements to be used for generating said layout constraints, said means for selecting operating in such manner as to select fewer than all of the plurality of circuit elements of the circuit configuration;

means for identifying a most critical path through each of said specified circuit elements based upon said static timing information represented in said netlist data structure; and means for generating circuit layout constraints from the most critical path through each of said specified circuit elements, wherein said generated layout constraints include at least one constraint involving circuit placement or signal routing, wherein said generating means including means for extracting and formatting irredundant layout constraints for use by an identified target circuit placement and signal routine tool, whereby at least one such circuit layout constraint is generated covering each of said specified circuit elements.

2. The system of claim 1, wherein said circuit elements include ports and nets.

3. The system of claim 2, wherein said specified circuit elements are nets.

4. The system of claim 2, wherein said specified circuit elements are driver pins.

5. The system of claim 2, wherein said specified circuit elements are load pins.

6. The system of claim 1, wherein said most critical path through each of said circuit elements is a path having the least slack for said circuit element, wherein slack is the difference between a required time at which a signal should reach the specified circuit element and an arrival time at which the signal is expected to reach the specified circuit element.

7. The system of claim 2, wherein said circuit elements further include net segments.

8. The system of claim 7, wherein said circuit elements further include driver pins and load pins.

9. The system of claim 8, wherein said circuit elements further include cell instances.

10. A digital computer system for processing a netlist to generate circuit layout constraints for use by an operatively connected circuit placement or signal routing program, the system including a computer having a memory for data storage and a processor for program execution, the computer system comprising:

a memory structure for storing a netlist data structure that represents a circuit configuration having a plurality of circuit elements, said structure further representing static timing information for said circuit configuration;

a selector for selecting specified circuit elements to be used for generating such layout constraints whereby only a proper subset of the plurality of circuit elements of said circuit configuration are selected as such specified circuit elements;

a timing analysis module for identifying a most critical path through each of said specified circuit elements based upon said static timing information represented in said netlist data structure;

a circuit layout constraint module for generating layout constraints from the most critical path through each of said specified circuit elements, wherein said generated layout constraints include at least one constraint involving circuit placement or signal routing, whereby at least one such circuit layout constraint is generated covering each of said specified circuit elements; and a target circuit placement and signal routing tool responsive to said circuit layout constraint module and to said memory structure storing said netlist data structure for performing circuit placement and signal routing to implement said circuit configuration within said generated layout constraints.

11. The system of claim 10, wherein said circuit elements include ports and nets.

12. The system of claim 11, wherein said specified circuit elements are nets.

13. The system of claim 11, wherein said circuit elements further include net segments.

14. The system of claim 13, wherein said circuit elements further include driver pins and load pins.

15. The system of claim 14, wherein said circuit elements further include cell instances.

16. A digital computer system for processing a netlist to generate circuit layout constraints, the system including a computer having a memory for data storage and a processor for program execution, the computer system comprising:

a memory-based technology library of circuit blocks, said library containing static timing information characteristic of each circuit block;

a memory structure for storing a netlist data structure that represents a circuit configuration having a plurality of circuit elements, said structure further representing static timing information for said circuit configuration with said static timing information being supplied by said technology library consistent with said characteristic;

a selector for selecting specified circuit elements to be used for generating such layout constraints;

a timing analysis module for identifying an irredundant critical path through each of said specified circuit elements based upon said static timing information represented in said netlist data structure;

a circuit layout constraint module for generating circuit layout constraints from the irredundant critical path through each of said specified circuit elements, said generated circuit layout constraints including circuit placement and signal routing constraints; and a mode control input to said circuit layout constraint module for indication by a user of a desired format for the inputs or outputs to or from said circuit layout constraint module, whereby at least one circuit layout constraint is generated covering each of said specified circuit elements.

* * * * *